(12) United States Patent
Kim

(10) Patent No.: US 12,002,786 B2
(45) Date of Patent: Jun. 4, 2024

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Young Lyong Kim, Anyang-si (KR)

(73) Assignee: Samsung Electronics Co., Ltd. (KR)

(*) Notice: Subject to any disclaimer, the term of this patent is extended or adjusted under 35 U.S.C. 154(b) by 91 days.

(21) Appl. No.: 17/535,904

(22) Filed: Nov. 26, 2021

(65) Prior Publication Data

US 2022/0352124 A1 Nov. 3, 2022

(30) Foreign Application Priority Data

May 3, 2021 (KR) .................. 10-2021-0057323

(51) Int. Cl.
| | |
|---|---|
| *H01L 25/065* | (2023.01) |
| *H01L 23/00* | (2006.01) |
| *H01L 23/31* | (2006.01) |
| *H01L 25/00* | (2006.01) |

(52) U.S. Cl.
CPC ...... *H01L 25/0657* (2013.01); *H01L 23/3128* (2013.01); *H01L 23/3171* (2013.01); *H01L 24/06* (2013.01); *H01L 24/16* (2013.01); *H01L 24/17* (2013.01); *H01L 24/81* (2013.01); *H01L 25/50* (2013.01); *H01L 2224/06515* (2013.01); *H01L 2224/16145* (2013.01); *H01L 2224/16225* (2013.01); *H01L 2224/1703* (2013.01); *H01L 2224/81815* (2013.01)

(58) Field of Classification Search
None
See application file for complete search history.

(56) References Cited

U.S. PATENT DOCUMENTS

| | | | |
|---|---|---|---|
| 6,163,076 | A | 12/2000 | Lee et al. |
| 6,936,929 | B1 | 8/2005 | Mostafazadeh et al. |
| 7,144,800 | B2 | 12/2006 | Mostafazadeh et al. |
| 7,190,059 | B2 | 3/2007 | Hagen et al. |
| 7,476,036 | B2 | 1/2009 | Auburger et al. |
| 7,846,773 | B2 | 12/2010 | Galera et al. |
| 8,288,203 | B2 | 10/2012 | Cho et al. |
| 8,587,134 | B2 | 11/2013 | Im et al. |

(Continued)

FOREIGN PATENT DOCUMENTS

KR 1020060071937 A 6/2006

*Primary Examiner* — Long Pham
(74) *Attorney, Agent, or Firm* — Fish & Richardson P.C.

(57) ABSTRACT

A semiconductor package includes a first semiconductor chip mounted on a substrate, a first conductive post disposed on the substrate and spaced apart from the first semiconductor chip, a second semiconductor chip disposed on the first semiconductor chip and the first conductive post, and a mold layer on the substrate that covers the first and second semiconductor chips and the first conductive post. The second semiconductor chip is supported on the first semiconductor chip by a first dummy solder terminal provided between the first and second semiconductor chips, and is coupled to the first conductive post by a first signal solder terminal provided between the first conductive post and the second semiconductor chip. The first dummy solder terminal is in direct contact with a top surface of the first semiconductor chip, and is electrically disconnected from the second semiconductor chip.

9 Claims, 18 Drawing Sheets

(56) References Cited

U.S. PATENT DOCUMENTS

| | | |
|---|---|---|
| 9,711,482 B2 | 7/2017 | Lee et al. |
| 10,453,821 B2 | 10/2019 | Lee et al. |
| 10,658,332 B2 * | 5/2020 | Sung .................... H01L 23/5226 |
| 10,818,632 B1 | 10/2020 | Ramachandran et al. |
| 10,886,223 B2 * | 1/2021 | Zhuang .................... H01L 24/19 |
| 11,127,687 B2 * | 9/2021 | Choi ........................ H01L 24/20 |
| 11,322,446 B2 * | 5/2022 | Kim ......................... H01L 24/32 |
| 11,495,545 B2 * | 11/2022 | Kim ..................... H01L 23/5386 |
| 2019/0312016 A1 | 10/2019 | Osullivan et al. |
| 2020/0098727 A1 | 3/2020 | Mallik et al. |
| 2020/0273799 A1 * | 8/2020 | Sung ........................ H01L 24/17 |
| 2020/0273801 A1 | 8/2020 | Kim et al. |
| 2021/0193622 A1 * | 6/2021 | Choi .................... H01L 23/5384 |

\* cited by examiner

SEMICONDUCTOR PACKAGE AND METHOD OF FABRICATING THE SAME

CROSS-REFERENCE TO RELATED APPLICATIONS

A claim of priority under 35 U.S.C. § 119 is made to Korean Patent Application No. 10-2021-0057323, filed on May 3, 2021, in the Korean Intellectual Property Office, the entirety of which is hereby incorporated by reference.

BACKGROUND OF THE INVENTION

The present disclosure relates to semiconductor packages and methods of fabricating the same.

Recently, demand for portable electronic devices is rapidly increasing in the market, and thus it is necessary to provide electronic components constituting portable electronic devices that are capable of high performance, and that have small size and minimal weight. Especially, there is an increasing demand to provide high-performance, high bandwidth, and high processing capacity memory semiconductor devices.

To reduce the size and weight of electronic components, it is necessary to develop technologies that reduce the size of each component, and packaging technologies that integrate several components in a single package. In particular, for semiconductor packages that process high frequency signals, it is necessary not only to reduce a size of the product but also to realize improved electrical characteristics.

In general, through-silicon via (TSV) process technology, flip chip process technology, wire bonding process technology, or the like are used to stack a plurality of memory chips on a package substrate. However, TSV process technology suffers from high complexity and high cost, and thus it is necessary to develop process technologies capable of overcoming difficulties of TSV process technology.

SUMMARY

Embodiments of the inventive concepts provide a semiconductor package with improved structural stability and a method of fabricating the same. Embodiments of the inventive concepts also provide a semiconductor package with improved electric characteristics and a method of fabricating the same.

Embodiments of the inventive concepts provide a semiconductor package including a first semiconductor chip mounted on a substrate; a first conductive post disposed on the substrate and spaced apart from the first semiconductor chip; a second semiconductor chip disposed on the first semiconductor chip and the first conductive post; and a mold layer on the substrate that covers the first semiconductor chip, the second semiconductor chip, and the first conductive post. The second semiconductor chip is supported on the first semiconductor chip by a first dummy solder terminal, and the first dummy solder terminal is between the first semiconductor chip and the second semiconductor chip. The second semiconductor chip is coupled to the first conductive post by a first signal solder terminal, and the first signal solder terminal is between the first conductive post and the second semiconductor chip. The first dummy solder terminal is in direct contact with a top surface of the first semiconductor chip, and is electrically disconnected from the second semiconductor chip.

Embodiments of the inventive concepts further provide a semiconductor package including a substrate; a first semiconductor chip and a second semiconductor chip sequentially stacked on the substrate; a mold layer covering the first and second semiconductor chips on the substrate; and outer terminals below the substrate. Each of the first and second semiconductor chips include a base layer having a bottom surface on which an integrated circuit is provided; a first pad in a first region on the bottom surface of the base layer; and a second pad in a second region spaced apart from the first region and on the bottom surface of the base layer. The first and second semiconductor chips are shifted from each other, and the second region of the second semiconductor chip is not overlapped with the first semiconductor chip. The second semiconductor chip is supported on a top surface of the first semiconductor chip by a first solder terminal, and the first solder terminal is on the first pad of the second semiconductor chip. The second semiconductor chip is electrically connected to the substrate through a conductive post on the substrate and a second solder terminal connecting the conductive post to the second pad of the second semiconductor chip. The top surface of the first semiconductor chip and a top surface of the conductive post may be located at different levels from a top surface of the substrate. A bottom surface of the second semiconductor chip is substantially parallel to the top surface of the substrate.

Embodiments of the inventive concepts still further provide a method of fabricating a semiconductor package may including providing a substrate; forming a conductive post on the substrate; mounting a first semiconductor chip on the substrate spaced apart from the conductive post; mounting a second semiconductor chip on the conductive post and the first semiconductor chip; and forming a mold layer on the substrate to cover the conductive post, the first semiconductor chip, and the second semiconductor chip. The mounting of the second semiconductor chip includes attaching a first solder terminal to a dummy pad of the second semiconductor chip and a second solder terminal to a signal pad of the second semiconductor chip; aligning the second semiconductor chip on the first semiconductor chip to place the first solder terminal attached to the signal pad on the conductive post and to place the second solder terminal attached to the dummy pad on the first semiconductor chip; and performing a reflow process on the first and second solder terminals to respectively form a signal solder terminal connecting the signal pad to the conductive post and a dummy solder terminal connecting the dummy pad to a top surface of the first semiconductor chip. The top surface of the first semiconductor chip and a top surface of the conductive post are located at different levels from the substrate, and a bottom surface of the second semiconductor chip may be substantially parallel to a top surface of the substrate after the reflow process.

Embodiments of the inventive concepts also provide a semiconductor package including a substrate; a first semiconductor chip mounted on the substrate; a second semiconductor chip stacked on the first semiconductor chip, the second semiconductor chip including a first region that overlaps the first semiconductor chip in plan view and a second region that does not overlap the first semiconductor chip in plan view; a plurality of first conductive posts disposed on the substrate under the second region of the second semiconductor chip; a plurality of first solder terminals directly on the first semiconductor chip that support the second semiconductor chip at the first region and are electrically disconnected from the second semiconductor chip; and a plurality of second solder terminals respectively electrically connecting the plurality of first conductive posts to the second semiconductor chip.

BRIEF DESCRIPTION OF THE DRAWINGS

Embodiments of the inventive concepts will be described more fully with reference to the accompanying drawings, in which like reference characters refer to like parts throughout the different view unless otherwise specified. It should be understood that the drawings are not necessarily to scale, with emphasis being placed on illustrating principles of the inventive concepts.

DETAILED DESCRIPTION

Figure 1:
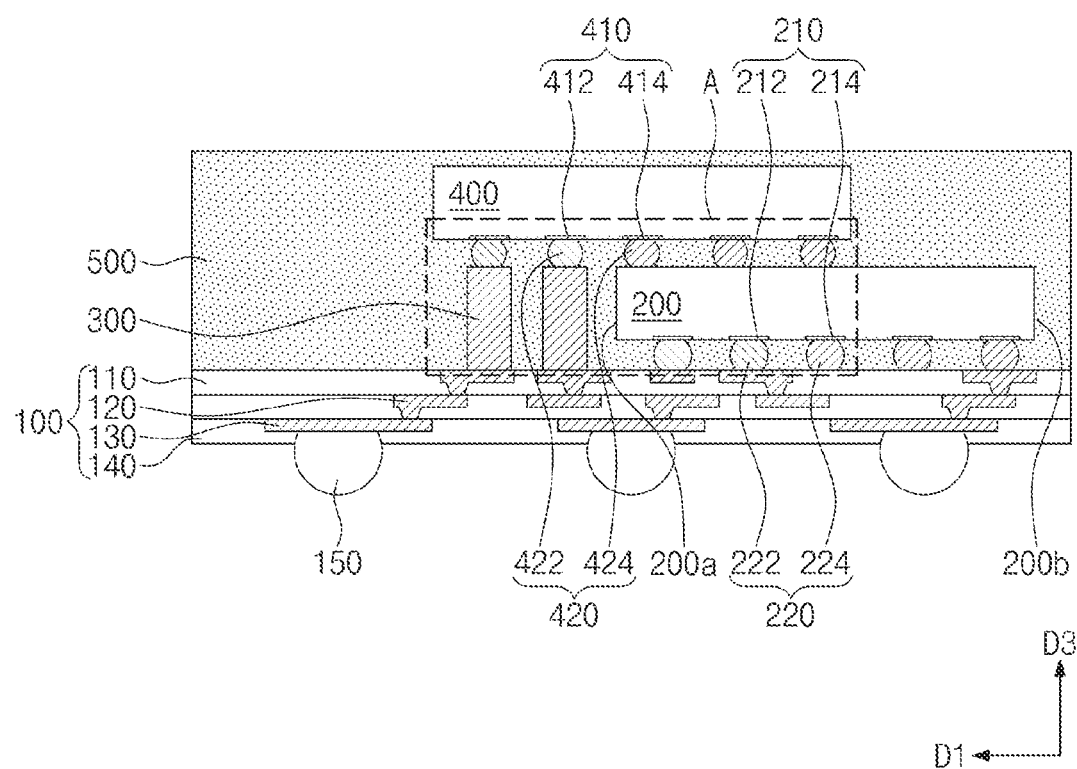
FIG. 1 illustrates a sectional view of a semiconductor package according to embodiments of the inventive concepts.
Figure 2:
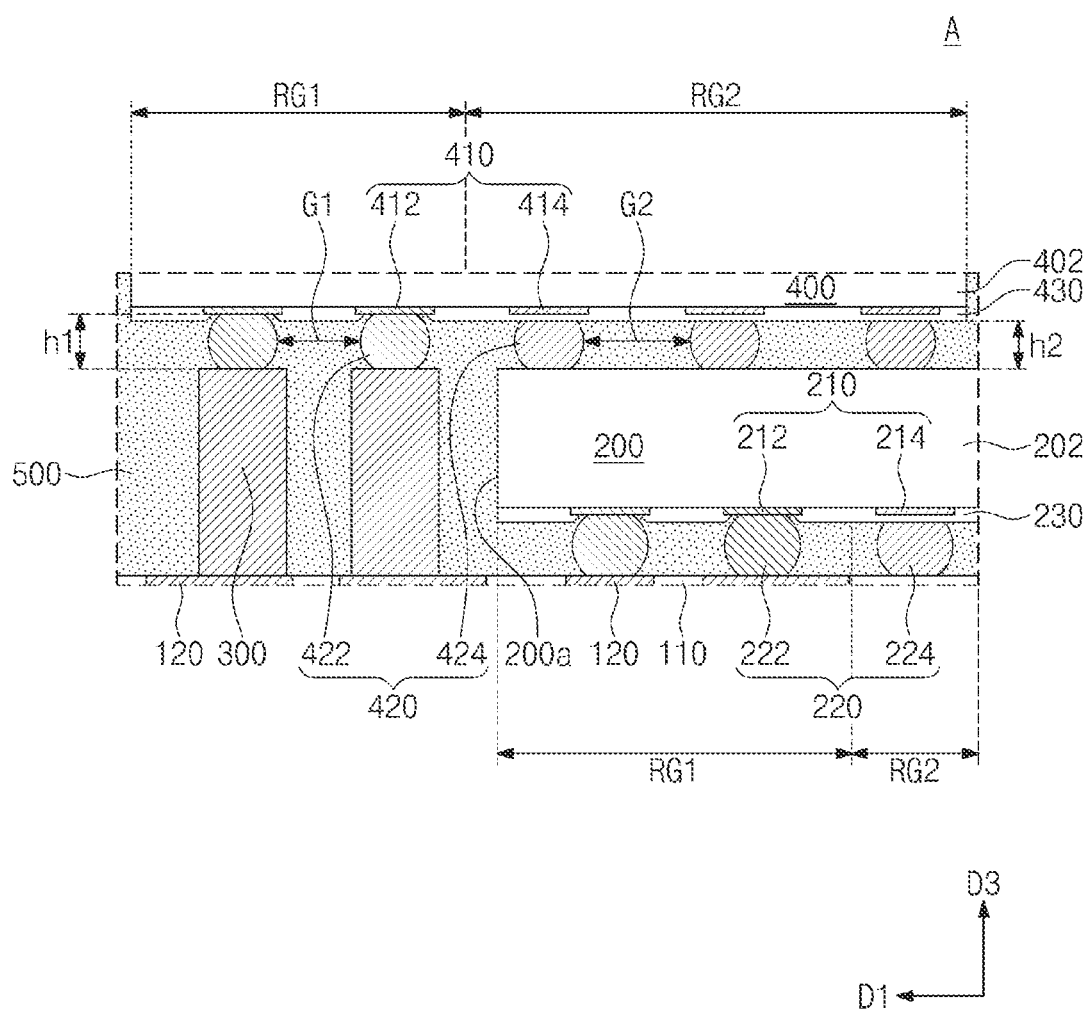
FIG. 2 illustrates an enlarged sectional view of portion 'A' of FIG. 1.
Figure 3:
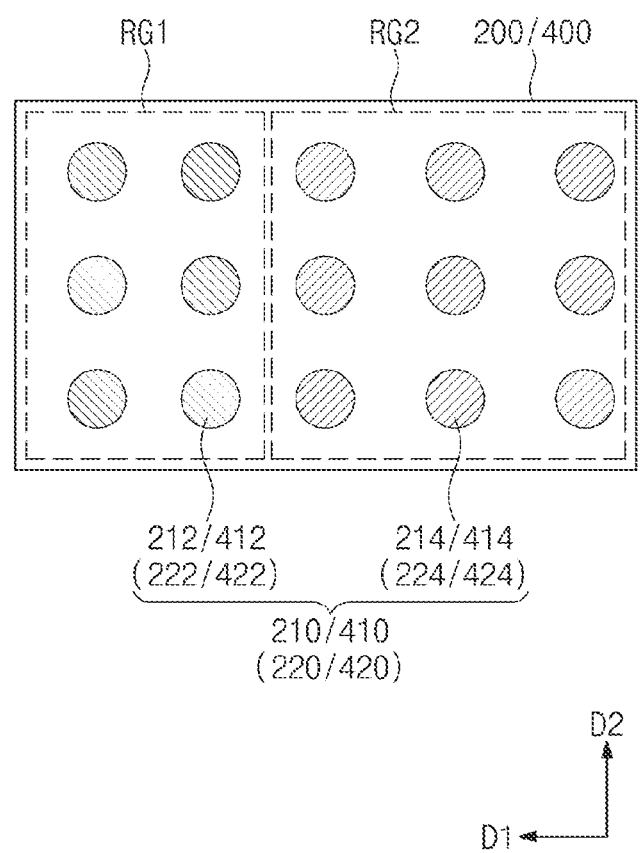
FIG. 3 illustrates a plan view of arrangements of soldering structures in first and second semiconductor chips of a semiconductor package according to embodiments of the inventive concepts.
Figure 4:
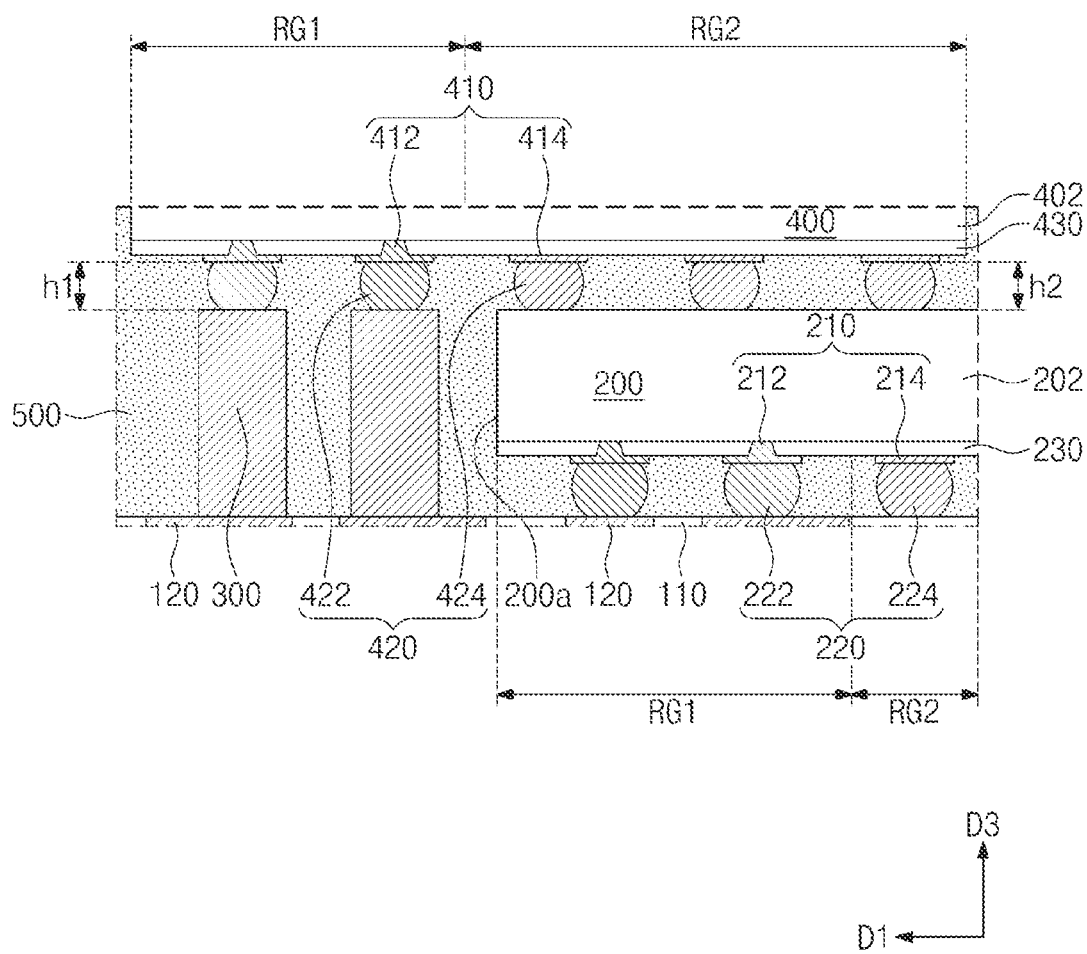
FIG. 4 illustrates an enlarged sectional view of the portion 'A' of FIG. 1 according to embodiments of the inventive concepts.
Figure 5:
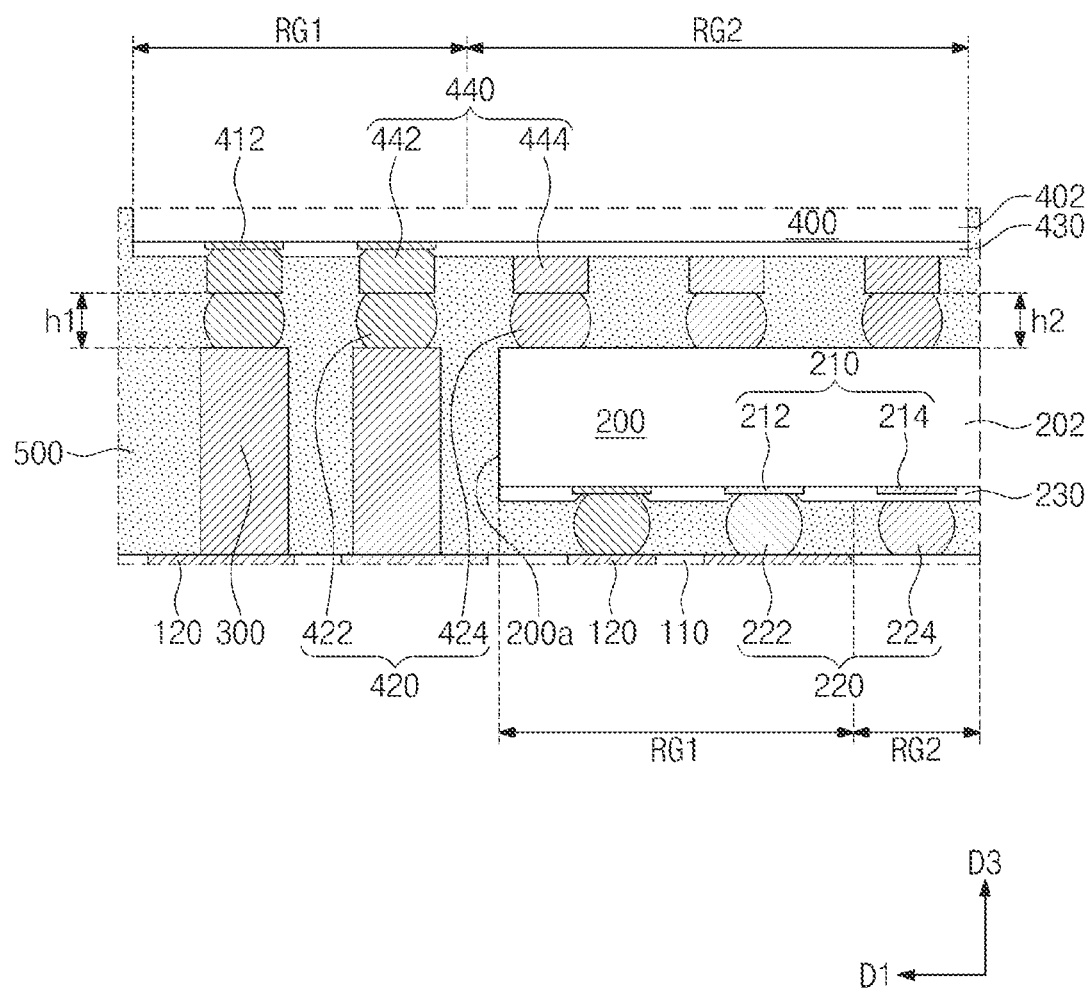
FIG. 5 illustrates an enlarged sectional view of the portion 'A' of FIG. 1 according to embodiments of the inventive concepts.
Figure 6:
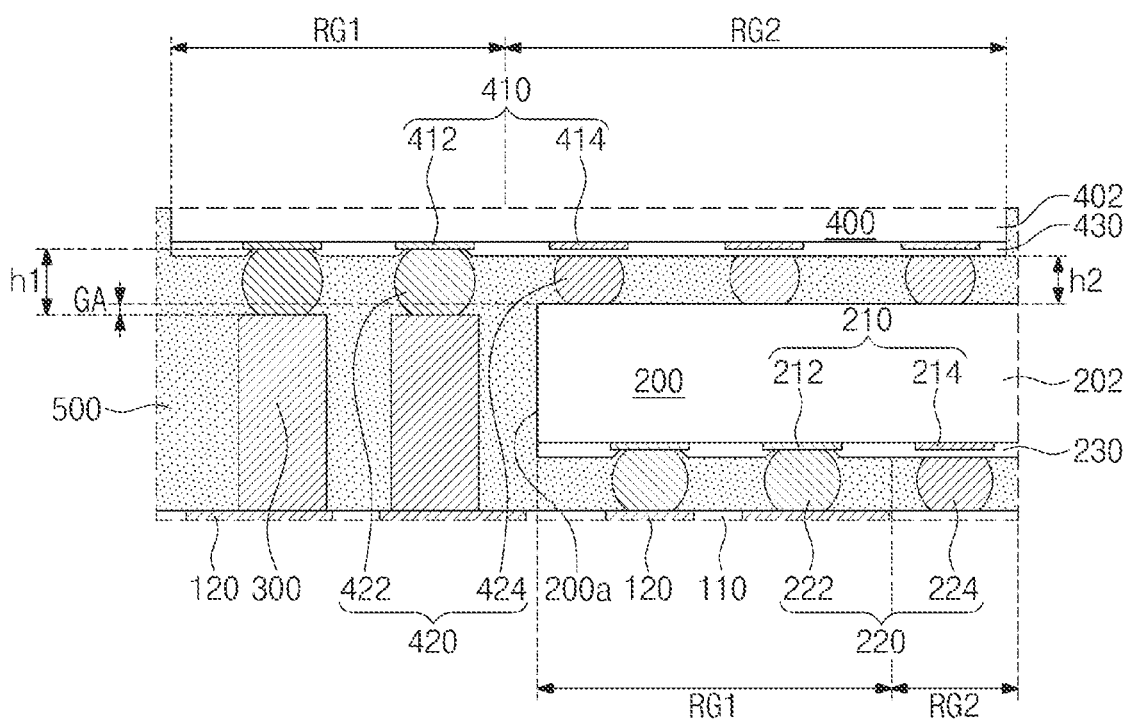
FIG. 6 illustrates an enlarged sectional view of the portion 'A' of FIG. 1 according to embodiments of the inventive concepts.

FIG. 1 illustrates a sectional view of a semiconductor package according to embodiments of the inventive concepts. FIG. 2 illustrates an enlarged sectional view of portion 'A' of FIG. 1. FIG. 3 illustrates a plan view of arrangements of soldering structures in first and second semiconductor chips of a semiconductor package according to embodiments of the inventive concepts. FIGS. 4 to 6 illustrate enlarged sectional views of the portion 'A' of FIG. 1.

Referring to FIGS. 1 and 2, a substrate may be provided. The substrate 100 may be a redistribution substrate. For example, the substrate 100 may include at least one substrate interconnection layer. In an embodiment, the substrate 100 may include a plurality of substrate interconnection layers, which are sequentially stacked, and in this case, each of the substrate interconnection layers may include a substrate insulating layer 110 and a substrate interconnection pattern 120 in the substrate insulating layer 110. The substrate interconnection pattern 120 of one of the substrate interconnection layers may be electrically connected to the substrate interconnection pattern 120 of another adjacent substrate interconnection layer (not shown).

The substrate insulating layer 110 may include for example at least one of insulating polymers or photoimageable polymers (e.g., photoimageable dielectric (PID)). In embodiments, the photoimageable polymers may include for example photo-imageable polyimides, polybenzoxazole (PBO), phenol-based polymers, and benzocyclobutene-based polymers.

The substrate interconnection pattern 120 may be provided in the substrate insulating layer 110. The substrate interconnection pattern 120 may be horizontally extended in the substrate insulating layer 110. For example, the substrate interconnection pattern 120 may serve as a pad portion or a line portion of the substrate interconnection layer. In other words, the substrate interconnection pattern 120 may be an element, which is provided in the substrate 100 for the purpose of horizontal redistribution. The substrate interconnection pattern 120 may be provided in an upper portion of the substrate insulating layer 110. A top surface of the substrate interconnection pattern 120 may be exposed to the outside of the substrate insulating layer 110 near a top surface of the substrate insulating layer 110. The substrate interconnection pattern 120, which is provided in the uppermost one of the substrate interconnection layers, may be used as a pad, to which a first semiconductor chip 200 and first conductive posts 300 to be described below are coupled. The substrate interconnection pattern 120 may be formed of or include a conductive material. For example, the substrate interconnection pattern 120 may be formed of or include a metallic material (e.g., copper (Cu)).

The substrate interconnection pattern 120 may have a via extended in a downward direction. The via may be used to vertically connect the substrate interconnection patterns 120 of the substrate interconnection layers, which are adjacent to each other. In an embodiment, the via may be used to connect the substrate interconnection pattern 120 of the lowermost one of the substrate interconnection layers to one of substrate pads 130. For example, the via may be extended from a bottom surface of the substrate interconnection pattern 120 to penetrate the substrate insulating layer 110 and may be coupled to the top surface of the substrate interconnection pattern 120 of an underlying substrate interconnection layer. Alternatively, the via may be extended from the bottom surface of the substrate interconnection pattern 120 to penetrate the lowermost one of the substrate insulating layers 110 and may be coupled to a top surface of the substrate pad 130.

The substrate pads 130 may be provided on a bottom surface of the lowermost one of the substrate interconnection layers. The substrate pads 130 may be electrically connected to the substrate interconnection pattern 120. The substrate pads 130 may be used as pads, to which outer terminals 150 are coupled.

A substrate protection layer 140 may be provided. The substrate protection layer 140 may cover the bottom surface of the lowermost one of the substrate interconnection layers and may expose the substrate pads 130. The outer terminals 150 may be provided on the exposed bottom surface of the substrate pads 130. The outer terminals 150 may include solder balls or solder bumps for example.

The substrate 100 may be provided to have the afore-described structure. However, the inventive concepts are not limited to this example. The substrate 100 may be a printed circuit board (PCB). For example, the substrate 100 may include a core layer and peripheral portions which are used to connect interconnection lines on and below the core layer.

The first semiconductor chip 200 may be disposed on the substrate 100. The first semiconductor chip 200 may have a front surface and a rear surface. Hereinafter, in the present specification, the front surface may be a surface of the semiconductor chip on which an integrated circuit or pads are formed and may be called an active surface, and the rear surface may be a surface that is opposite to the front surface. For example, the first semiconductor chip 200 may include first chip pads 210 which are provided on the front surface thereof. The first semiconductor chip 200 may have a first side surface 200a and a second side surface 200b, which are opposite to each other in a first direction D1. Hereinafter, the first direction D1 and a second direction D2 (see FIG. 3) may be parallel to a top surface of the substrate 100 and may be orthogonal to each other, and a third direction D3 may be perpendicular to the top surface of the substrate 100. The first side surface 200a may be a side surface of the first semiconductor chip 200 in the first direction D1, and the second side surface 200b may be a side surface in a direction which is opposite to the first direction D1 of the first semiconductor chip 200. The first semiconductor chip 200 may be a memory chip (e.g., DRAM, SRAM, MRAM, or FLASH memory chip). Alternatively, the first semiconductor chip 200 may be a logic chip or may include a passive device. The first semiconductor chip 200 may be formed of or include a semiconductor material (e.g., silicon (Si)).

The first semiconductor chip 200 may be mounted on the substrate 100 in a flip-chip bonding manner. For example, the first semiconductor chip 200 may include a first base layer 202 on which the integrated circuit is formed, and the first chip pads 210 which are formed on a surface of the first base layer 202 provided with the integrated circuit. The first semiconductor chip 200 may be disposed such that the first chip pads 210 face the substrate 100. In other words, the first semiconductor chip 200 may be disposed to have a front surface facing the substrate 100. First chip connection terminals 220 may be provided between the first chip pads 210 and the substrate 100. The first semiconductor chip 200 may be connected to the substrate 100 through the first chip pads 210, the first chip connection terminals 220, and the substrate interconnection pattern 120. The first chip connection terminals 220 may include solder balls or solder bumps (the solder balls and/or solder bumps may hereinafter be generally referred to as solder terminals).

The first chip pads 210 may include first signal pads 212 and first dummy pads 214 as particularly shown in FIG. 2. The first chip connection terminals 220 may include first signal solder terminals 222 provided on the first signal pads 212, and first dummy solder terminals 224 provided over but disconnected from the first dummy pads 214 as shown particularly in FIG. 2. FIG. 3 illustrates a bottom surface of the first semiconductor chip 200 or a second semiconductor chip 400 to be described hereinafter, and the chip pads 210 and 410 in FIG. 3 may be arranged in the same manner as the chip connection terminals 220 and 420 in FIG. 2.

Referring to FIGS. 1 to 3, the first semiconductor chip 200 may include a first region RG1 and a second region RG2. The first region RG1 may be located adjacent to the second region RG2 in the first direction D1. In other words, the first region RG1 may be a region which is adjacent to the first side surface 200a of the first semiconductor chip 200, and the second region RG2 may be a region which is adjacent to the second side surface 200b of the first semiconductor chip 200. The first region RG1 of the first semiconductor chip 200 may be defined as a region in which the first signal pads 212 are provided, and the second region RG2 of the first semiconductor chip 200 may be defined as a region in which the first dummy pads 214 are provided.

The first signal pads 212 may be disposed on the front surface of the first semiconductor chip 200 and in the first region RG1. The first dummy pads 214 may be disposed on the front surface of the first semiconductor chip 200 and in the second region RG2. The first signal pads 212 may be arranged in the first and second directions D1 and D2 in the first region RG1. However, the inventive concepts are not limited to this example, and the arrangement of the first signal pads 212 may be variously changed depending on a redistribution structure required for the first semiconductor chip 200. The first dummy pads 214 may be arranged in the first and second directions D1 and D2 in the second region RG2. However, the inventive concepts are not limited to this example, and the arrangement of the first dummy pads 214 may be variously changed depending on the shape of the first semiconductor chip 200 and the arrangement of the first signal pads 212. A distance between the first dummy pads 214 may be larger than a distance between the first signal pads 212.

The first signal solder terminals 222 and the first dummy solder terminals 224 may be provided on the front surface of the first semiconductor chip 200. The first signal solder terminals 222 may be provided on the first signal pads 212 respectively, and the first dummy solder terminals 224 may be provided over but disconnected from the first dummy pads 214 respectively. The first signal solder terminals 222 may be arranged in the same manner as the first signal pads 212. For example, the first signal solder terminals 222 may be arranged in the first and second directions D1 and D2. The first dummy solder terminals 224 may be arranged in the same manner as the first dummy pads 214. For example, the first dummy solder terminals 224 may be arranged in the first and second directions D1 and D2. A distance between the first dummy solder terminals 224 may be larger than a distance between the first signal solder terminals 222. The first signal solder terminals 222 may connect the first signal pads 212 to the substrate interconnection pattern 120. In other words, the first signal solder terminals 222 may electrically connect the first semiconductor chip 200 to the substrate 100. The first dummy solder terminals 224 may be provided on the substrate 100 to support the first semiconductor chip 200. Here, the first dummy solder terminals 224 may be connected to the substrate interconnection pattern 120 of the substrate 100 or may be disposed on the substrate insulating layer 110 of the substrate 100 as shown in FIG. 1 for example.

According to embodiments of the inventive concepts, the first dummy solder terminals 224 may be provided in the second region RG2 in which the first signal solder terminals 222 are not provided, so as to support the first semiconductor chip 200 in an upward direction, and thus, the first semiconductor chip 200 may be more robustly disposed on the substrate 100. In other words, a semiconductor package with improved structural stability may be provided.

The first signal solder terminals 222 are electrically connected to the integrated circuit of the first semiconductor chip 200. The first dummy solder terminals 224 are electrically disconnected from the first semiconductor chip 200. As shown in FIG. 2, the first semiconductor chip 200 may further include a first chip passivation layer 230 which is provided on a top surface thereof. The first chip passivation layer 230 may cover the front surface of the first semiconductor chip 200, may expose the first signal pads 212, and may cover the first dummy pads 214. The first signal solder terminals 222 may be provided to penetrate the first chip passivation layer 230 and may be coupled to the first signal pads 212. The first dummy solder terminals 224 may be disposed over the first dummy pads 214 and spaced apart from the first dummy pads 214 by the first chip passivation layer 230. In other words, the first dummy solder terminals 224 are electrically disconnected from the first dummy pads 214 and thus electrically disconnected from the integrated circuit of the first semiconductor chip 200.

Unlike the structure shown in FIG. 2, in some embodiments the first semiconductor chip 200 may not include the first dummy pads 214. In other words, the first dummy solder terminals 224 may be provided on the first chip passivation layer 230 in the second region RG2, and the first dummy pads 214 may not be provided between the first dummy solder terminals 224 and the first semiconductor chip 200.

In an embodiment as shown in FIG. 4, the first semiconductor chip 200 may further include the first chip passivation layer 230 which is provided on a top surface thereof. The first chip passivation layer 230 may cover the front surface of the first semiconductor chip 200. The first signal pads 212 and the first dummy pads 214 may be disposed on the first chip passivation layer 230. Here, the first signal pads 212 may be provided to penetrate the first chip passivation layer 230 and may be coupled to the integrated circuit of the first semiconductor chip 200. The first dummy pads 214 may be spaced apart from the integrated circuit of the first semiconductor chip 200 by the first chip passivation layer 230 and may be electrically separated from the integrated circuit of the first semiconductor chip 200 to be in a floating state.

The first signal solder terminals 222 may be coupled to the first signal pads 212. Accordingly, the first signal solder terminals 222 may be electrically connected to the integrated circuit of the first semiconductor chip 200 through the first signal pads 212. The first dummy solder terminals 224 may be coupled to the first dummy pads 214. However, since the first dummy pads 214 are spaced apart from the integrated circuit of the first semiconductor chip 200 by the first chip passivation layer 230 and are in an electrically floating state, the first dummy solder terminals 224 may be electrically disconnected from the integrated circuit of the first semiconductor chip 200.

Unlike the structure of FIG. 4, in some embodiments the first semiconductor chip 200 may not include the first dummy pads 214. In other words, the first dummy solder terminals 224 may be provided on the first chip passivation layer 230 in the second region RG2, and the first dummy pads 214 not provided between the first dummy solder terminals 224 and the first chip passivation layer 230. The description that follows will be based on the embodiment of FIG. 2.

Referring back to FIGS. 1 and 2, the first conductive posts 300 may be disposed on the substrate 100. The first conductive posts 300 may be disposed near a side surface of the first semiconductor chip 200 in the first direction D1. For example, the first conductive posts 300 may be disposed adjacent to the first side surface 200a of the first semiconductor chip 200. Each of the first conductive posts 300 may be a pillar shaped structure that is extended in the third direction D3. The first conductive posts 300 may be coupled to the substrate interconnection patterns 120 of the substrate 100. The first conductive posts 300 may have top surfaces that are located at the same level as the top surface of the first semiconductor chip 200, when measured from the substrate 100. Alternatively, the top surfaces of the first conductive posts 300 may be located at a level different from the top surface of the first semiconductor chip 200, when measured from the substrate 100. This will be described in more detail with reference to FIG. 6. The first conductive posts 300 may be formed of or include a metallic material (e.g., copper (Cu) or tungsten (W)). Although not shown, each of the first conductive posts 300 may include a seed layer covering bottom and side surfaces thereof.

The second semiconductor chip 400 may be disposed on the first semiconductor chip 200 and the first conductive posts 300. The second semiconductor chip 400 may be placed on a rear surface of the first semiconductor chip 200. The second semiconductor chip 400 and the first semiconductor chip 200 may be disposed to form an offset stack structure. For example, the first and second semiconductor chips 200 and 400 may be stacked to form a stepwise structure that is upwardly inclined in the first direction D1. In detail, a portion of the second semiconductor chip 400 may be overlapped with the first semiconductor chip 200, and another portion may protrude out beyond one of the side surfaces of the first semiconductor chip 200 along the first direction D1 so as not to overlap with the first semiconductor chip 200. The second semiconductor chip 400 may protrude out beyond the first side surface 200a of the first semiconductor chip 200. In other words, the second semiconductor chip 400 may be stacked on the first semiconductor chip 200 such that it is shifted from the first semiconductor chip 200 in the first direction D1 when viewed in a plan view. Here, a portion of the second semiconductor chip 400 which protrudes beyond the first side surface 200a of the first semiconductor chip 200 may be placed on the first conductive posts 300. A front surface of the second semiconductor chip 400 (i.e., a bottom surface of the second semiconductor chip 400) may be substantially parallel to the top surface of the substrate 100.

The second semiconductor chip 400 may have the same or similar structure as the afore-described first semiconductor chip 200. In other words, the second semiconductor chip 400 and the first semiconductor chip 200 may be the same semiconductor chips, or in other words may be the same type of semiconductor chips or generally configured the same as each other. For example, the second semiconductor chip 400 may include second chip pads 410 which are provided on a front surface thereof. The second semiconductor chip 400 may be a memory chip. In contrast, the second semiconductor chip 400 may include a logic chip or may include a passive device. The second semiconductor chip 400 may be formed of or include a semiconductor material (e.g., silicon (Si)).

The second semiconductor chip 400 may be mounted on the first conductive posts 300 in a flip-chip bonding manner. For example, the second semiconductor chip 400 may include a second base layer 402 on which the integrated circuit is formed, and the second chip pads 410 which are disposed on a surface of the second base layer 402 provided with the integrated circuit. The second semiconductor chip 400 may be disposed such that the second chip pads 410 face the substrate 100. In other words, the second semiconductor chip 400 may have a front surface facing the substrate 100. Second chip connection terminals 420 may be provided between the second chip pads 410 and the first conductive posts 300. The second semiconductor chip 400 may be connected to the substrate 100 through the second chip pads 410, the second chip connection terminals 420, the first conductive posts 300, and the substrate interconnection pattern 120. The second chip connection terminals 420 may include solder balls or solder bumps.

The second chip pads 410 may include second signal pads 412 and second dummy pads 414. The second chip connection terminals 420 may include second signal solder terminals 422 provided on the second signal pads 412, and second dummy solder terminals 424 provided over but disconnected from the second dummy pads 414.

Referring to FIGS. 1 to 3, the second semiconductor chip 400 may include the first region RG1 and the second region RG2. The first region RG1 may be located adjacent to the second region RG2 in the first direction D1. When viewed in a plan view, the first region RG1 of the second semiconductor chip 400 may be placed on the first conductive posts 300, and the second region RG2 of the second semiconductor chip 400 may be placed on the first semiconductor chip 200. The first region RG1 of the second semiconductor chip 400 may be defined as a region in which the second signal pads 412 are provided, and the second region RG2 of the second semiconductor chip 400 may be defined as a region in which the second dummy pads 414 are provided.

The second signal pads 412 may be disposed on the front surface of the second semiconductor chip 400 and in the first region RG1. The second dummy pads 414 may be disposed on the front surface of the second semiconductor chip 400 and in the second region RG2. The second signal pads 412 may be arranged in the first and second directions D1 and D2 in the first region RG1. The second dummy pads 414 may be arranged in the first and second directions D1 and D2 in the second region RG2. A distance between the second dummy pads 414 may be greater than a distance between the second signal pads 412.

The second signal solder terminals 422 and the second dummy solder terminals 424 may be provided on the front surface of the second semiconductor chip 400. The second signal solder terminals 422 may be provided on the second signal pads 412 respectively, and the second dummy solder terminals 424 may be provided over but disconnected from the second dummy pads 414 respectively. The second signal solder terminals 422 may be arranged in the same manner as the second signal pads 412. For example, the second signal solder terminals 422 may be arranged in the first and second directions D1 and D2. The second dummy solder terminals 424 may be arranged in the same manner as the second dummy pads 414. For example, the second dummy solder terminals 424 may be arranged in the first and second directions D1 and D2. The second distance G2 between the second dummy solder terminals 424 may be larger than the first distance G1 between the first signal solder terminals 222. The second signal solder terminals 422 may be provided between the second signal pads 412 and the first conductive posts 300 on the first region RG1. The second signal solder terminals 422 may connect the second signal pads 412 to the first conductive posts 300. In other words, the second semiconductor chip 400 may be electrically connected to the substrate 100 through the second signal solder terminals 422 and the first conductive posts 300. A first height h1 of the second signal solder terminals 422 may be given as a distance between the second signal pads 412 and the first conductive posts 300. The second dummy solder terminals 424 may be provided between the second dummy pads 414 and the rear surface of the first semiconductor chip 200 in the second region RG2. The second dummy solder terminals 424 may be provided on the rear surface of the first semiconductor chip 200 to support the second semiconductor chip 400. Here, the second dummy solder terminals 424 may be in direct contact with the rear surface of the first semiconductor chip 200 (i.e., a top surface of the first base layer 202). A second height h2 of the second dummy solder terminals 424 may be given as a distance between the first and second semiconductor chips 200 and 400.

The second signal solder terminals 422 may be electrically connected to the integrated circuit of the second semiconductor chip 400. The second dummy solder terminals 424 may be electrically separated from the second semiconductor chip 400. As shown in FIG. 2, the second semiconductor chip 400 may further include a second chip passivation layer 430 which is provided on a top surface thereof. The second chip passivation layer 430 may cover the front surface of the second semiconductor chip 400, may expose the second signal pads 412, and may cover the second dummy pads 414. The second signal solder terminals 422 may be provided to penetrate the second chip passivation layer 430 and may be coupled to the second signal pads 412. The second dummy solder terminals 424 may be disposed over but disconnected from the second dummy pads 414, and may be spaced apart from the second dummy pads 414 by the second chip passivation layer 430. In other words, the second dummy solder terminals 424 are electrically separated from the second dummy pads 414, and thus electrically separated from the integrated circuit of the second semiconductor chip 400. In the case where the top surface of the first semiconductor chip 200 and the top surfaces of the first conductive posts 300 are located at the same level from the substrate 100, the second chip passivation layer 430 may be provided to cover the second dummy pads 414, and thus the first height h1 of the second signal solder terminals 422 may be greater than the second height h2 of the second dummy solder terminals 424.

Unlike the illustrated structure, in some embodiments the second semiconductor chip 400 may not include the second dummy pads 414. In other words, the second dummy solder terminals 424 may be provided on the second chip passivation layer 430 and in the second region RG2, and the second dummy pads 414 may not be provided between the second dummy solder terminals 424 and the second semiconductor chip 400.

In an embodiment as shown in FIG. 4, the second semiconductor chip 400 may further include the second chip passivation layer 430 which is provided on a top surface thereof. The second chip passivation layer 430 may cover the front surface of the second semiconductor chip 400. The second signal pads 412 and the second dummy pads 414 may be disposed on the second chip passivation layer 430. Here, the second signal pads 412 may penetrate the second chip passivation layer 430 and may be coupled to the integrated circuit of the second semiconductor chip 400. The second dummy pads 414 may be spaced apart from the integrated circuit of the second semiconductor chip 400 by the second chip passivation layer 430 and may be electrically separated from the integrated circuit of the second semiconductor chip 400.

The second signal solder terminals 422 may be coupled to the second signal pads 412. Accordingly, the second signal solder terminals 422 may be electrically connected to the integrated circuit of the second semiconductor chip 400 through the second signal pads 412. The second dummy solder terminals 424 may be coupled to the second dummy pads 414. However, the second dummy solder terminals 424 may be electrically disconnected from the integrated circuit of the second semiconductor chip 400 by the second chip passivation layer 430.

In the case where the top surface of the first semiconductor chip 200 and the top surfaces of the first conductive posts 300 are located at the same level from the substrate 100, the first height h1 of the second signal solder terminals 422 may be equal to the second height h2 of the second dummy solder terminals 424, because all of the second signal pads 412 and the second dummy pads 414 are provided on the second chip passivation layer 430.

Unlike the structure shown in FIG. 4, in some embodiments the second semiconductor chip 400 may not include the second dummy pads 414. In other words, the second dummy solder terminals 424 may be provided on the second chip passivation layer 430 in the second region RG2, and the second dummy pads 414 may not be provided between the second dummy solder terminals 424 and the second chip passivation layer 430. The description that follows will be based on the embodiment of FIG. 2.

In an embodiment as shown in FIG. 5, the second semiconductor chip 400 may further include pillars 440 provided on the second chip passivation layer 430. The pillars 440 may include first pillars 442 provided in the first region RG1 and second pillars 444 provided in the second region RG2. The first pillars 442 may penetrate the second chip passivation layer 430 and may be coupled to the second signal pads 412. The second pillars 444 may be disposed on the second chip passivation layer 430 and may be electrically disconnected from the integrated circuit of the second semiconductor chip 400 by the second chip passivation layer 430. FIG. 5 illustrates an example in which the second dummy pads 414 are not provided on the second region RG2, but the inventive concepts are not limited to this example. The second dummy pads 414 (e.g., see FIG. 2) may be provided on the second region RG2, and in this case, the second dummy pads 414 may be buried in the second chip passivation layer 430, and the second pillars 444 may be electrically disconnected from the second dummy pads 414 by the second chip passivation layer 430. The first pillars 442 and the second pillars 444 may have bottom surfaces that are located at the same level from the substrate 100.

The second signal solder terminals 422 may be provided on the bottom surfaces of the first pillars 442. The second signal solder terminals 422 may connect the first pillars 442 to the first conductive posts 300. The second dummy solder terminals 424 may be provided on the bottom surface of the second pillars 444. The second semiconductor chip 400 may be disposed on the first semiconductor chip 200 and may be supported by the second dummy solder terminals 424 and the second pillars 444.

Unlike the structure shown in FIG. 5, in some embodiments the first semiconductor chip 200 may be provided to have the same structure as the second semiconductor chip 400. For example, the first semiconductor chip 200 may further include pillars that are provided on the first chip passivation layer 230. Some of the pillars may be provided to penetrate the first chip passivation layer 230 and may be coupled to the first signal pads 212, and others of the pillars may be disposed on the first chip passivation layer 230 and electrically disconnected from the integrated circuit of the first semiconductor chip 200. The first signal solder terminals 222 may connect the some of the pillars to the substrate interconnection patterns 120 of the substrate 100. The first semiconductor chip 200 may be disposed on the substrate 100 and may be supported by the first dummy solder terminals 224 and the others of the pillars.

According to embodiments of the inventive concepts, since the first and second semiconductor chips 200 and 400 are vertically overlapped with each other, it may be possible to reduce an area of a region occupied by the first and second semiconductor chips 200 and 400 and to reduce a size of a semiconductor package. In addition, since the second semiconductor chip 400 is directly connected to the substrate 100 through the first conductive post 300, it may be possible to reduce a length of an electric connection path between the second semiconductor chip 400 and the substrate 100 and to improve electric characteristics of the semiconductor package. In addition, since the second semiconductor chip 400 on the first semiconductor chip 200 is supported by the second dummy solder terminals 424, the semiconductor package may have improved structural stability. The second dummy solder terminals 424 may be disposed regardless of an interconnection structure in each of the first and second semiconductor chip 200 and 400, and may be variously disposed (e.g., number and/or patterns/configurations) depending on a shape and a thickness of the second semiconductor chip 400. Thus, the second semiconductor chip 400 may be more stably supported on the first semiconductor chip 200, and the semiconductor package may have improved structural stability.

According to embodiments of the inventive concepts, the second dummy solder terminals 424 may be used to adjust a slope or inclination of the second semiconductor chip 400 that occurs due to a difference in level between the top surface of the first semiconductor chip 200 and the top surfaces of the first conductive posts 300. In other words, by using the second dummy solder terminals 424, the front surface of the second semiconductor chip 400 may be made to be substantially parallel with the front surface of the first semiconductor chip 200.

In an embodiment as shown in FIG. 6, there may be a height difference between surfaces on which the second semiconductor chip 400 is mounted, i.e., between the top surface of the first semiconductor chip 200 and the top surfaces of the first conductive posts 300. For example, the top surface of the first semiconductor chip 200 and the top surfaces of the first conductive posts 300 may be located at different levels from the substrate 100. A height difference GA between the top surface of the first semiconductor chip 200 and the top surfaces of the first conductive posts 300 may range from 0 μm to 100 μm. The height difference GA between the top surface of the first semiconductor chip 200 and the top surfaces of the first conductive posts 300 may be smaller than the first height h1 of the second signal solder terminals 422 or the second height h2 of the second dummy solder terminals 424. For example, the height difference GA between the top surface of the first semiconductor chip 200 and the top surfaces of the first conductive posts 300 may be 0.1 to 0.5 times the first height h1 of the second signal solder terminals 422 or the second height h2 of the second dummy solder terminals 424. The first height h1 of the second signal solder terminals 422 or the second height h2 of the second dummy solder terminals 424 may range from 10 μm to 250 μm. In an embodiment, the height difference GA between the top surface of the first semiconductor chip 200 and the top surfaces of the first conductive posts 300 is substantially equal to a difference between the first height h1 of the second signal solder terminals 422 and the second height h2 of the second dummy solder terminals 424.

In the case where the height difference GA between the top surface of the first semiconductor chip 200 and the top surfaces of the first conductive posts 300 is larger than the first height h1 of the second signal solder terminals 422 or the second height h2 of the second dummy solder terminals 424, the second signal solder terminals 422 may be spaced apart from the first conductive posts 300 or the second dummy solder terminals 424 may be spaced apart from the first semiconductor chip 200. As described above, the distance between the first and second semiconductor chips 200 and 400 may be different from the distance between the first conductive posts 300 and the second semiconductor chip 400. In this case, in order to level the second semiconductor chip 400, the first height h1 of the second signal solder terminals 422 and the second height h2 of the second dummy solder terminals 424 may have different values from each other.

For example, in the case where as shown in FIG. 6, the top surfaces of the first conductive posts 300 are located at a level lower than the top surface of the first semiconductor chip 200, the first height h1 of the second signal solder terminals 422 may be larger than the second height h2 of the second dummy solder terminals 424. In an embodiment, in the case where the top surfaces of the first conductive posts 300 are located at a level higher than the top surface of the first semiconductor chip 200, the first height h1 of the second signal solder terminals 422 may be smaller than the second height h2 of the second dummy solder terminals 424. Due to this difference between the first and second heights h1 and h2, it may be possible to prevent the second semiconductor chip 400 from being inclined when there is a height difference between the top surface of the first semiconductor chip 200 and the top surfaces of the first conductive posts 300 as a result of process fabrication of a semiconductor package. This will be described in more detail with reference to a fabrication method and the accompanying drawings.

Referring back to FIGS. 1 and 2, a mold layer 500 may be provided on the substrate 100. The mold layer 500 may cover the substrate 100. The mold layer 500 may be provided on the substrate 100 to encapsulate the first conductive posts 300, the first semiconductor chip 200, and the second semiconductor chip 400. For example, the mold layer 500 may cover side and top surfaces of the first semiconductor chip 200, and side and top surfaces of the second semiconductor chip 400. Unlike the illustrated structure, in some embodiments the mold layer 500 may expose the top surface of the second semiconductor chip 400. The mold layer 500 may fill a space which is located near a side surface of the first semiconductor chip 200 and between the substrate 100 and the second semiconductor chip 400. The mold layer 500 may be provided between the substrate 100 and the second semiconductor chip 400 to enclose the first conductive posts 300. The mold layer 500 may be in contact with the side surfaces of the first conductive posts 300. The mold layer 500 may be extended into a gap region between the first semiconductor chip 200 and the substrate 100 to encapsulate the first chip connection terminals 220, and may be extended into a gap region between the first and second semiconductor chips 200 and 400 to encapsulate the second dummy solder terminals 424. The mold layer 500 may be formed of or include at least one of insulating polymers (e.g., epoxy molding compound (EMC)).

Figure 7:
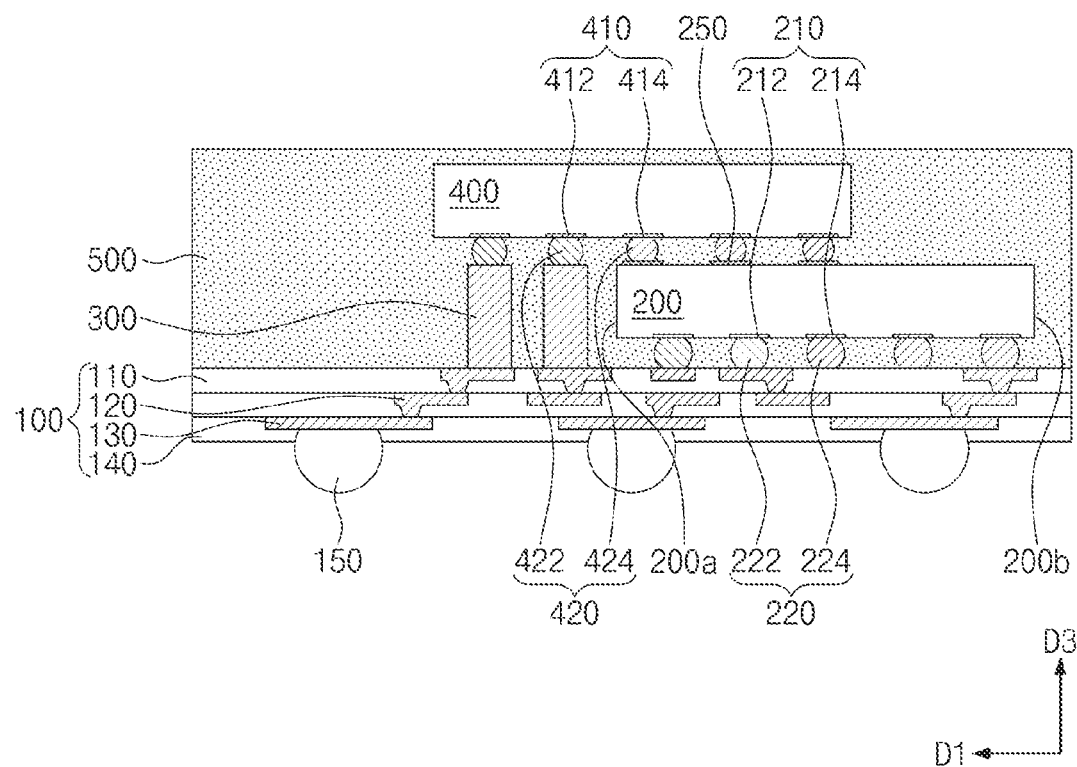
FIG. 7 illustrates a sectional view of a semiconductor package according to embodiments of the inventive concepts.

FIG. 7 illustrates a sectional view of a semiconductor package according to embodiments of the inventive concepts.

Referring to FIG. 7, the first semiconductor chip 200 may include upper pads 250. The upper pads 250 may be provided on the top surface of the first semiconductor chip 200. Here, the upper pads 250 may be disposed below the second region RG2 of the second semiconductor chip 400. More specifically, the upper pads 250 may be respectively provided at positions vertically corresponding to the second dummy pads 414 of the second semiconductor chip 400. For example, each of the upper pads 250 may be vertically overlapped with a corresponding one of the second dummy pads 414. The upper pads 250 may be formed of or include a metallic material (e.g., copper (Cu)). The second dummy solder terminals 424 may connect the upper pads 250 to the second dummy pads 414.

According to embodiments of the inventive concepts, the second dummy solder terminals 424 may be provided on the first semiconductor chip 200 and may be coupled to the upper pads 250 and the second dummy pads 414. In detail, the second dummy solder terminals 424 may be connected to the upper pads 250 and the second dummy pads 414, which are formed of a metallic material, through a soldering process, and thus the second semiconductor chip 400 may be more robustly bonded to the first semiconductor chip 200. Here, since the second dummy pads 414 are electrically disconnected from the integrated circuit of the second semiconductor chip 400, it may be possible to prevent the second semiconductor chip 400 from being unintentionally electrically connected or shorted to the first semiconductor chip 200 through the second dummy pads 414, the second dummy solder terminals 424, and the upper pads 250.

Figure 8:
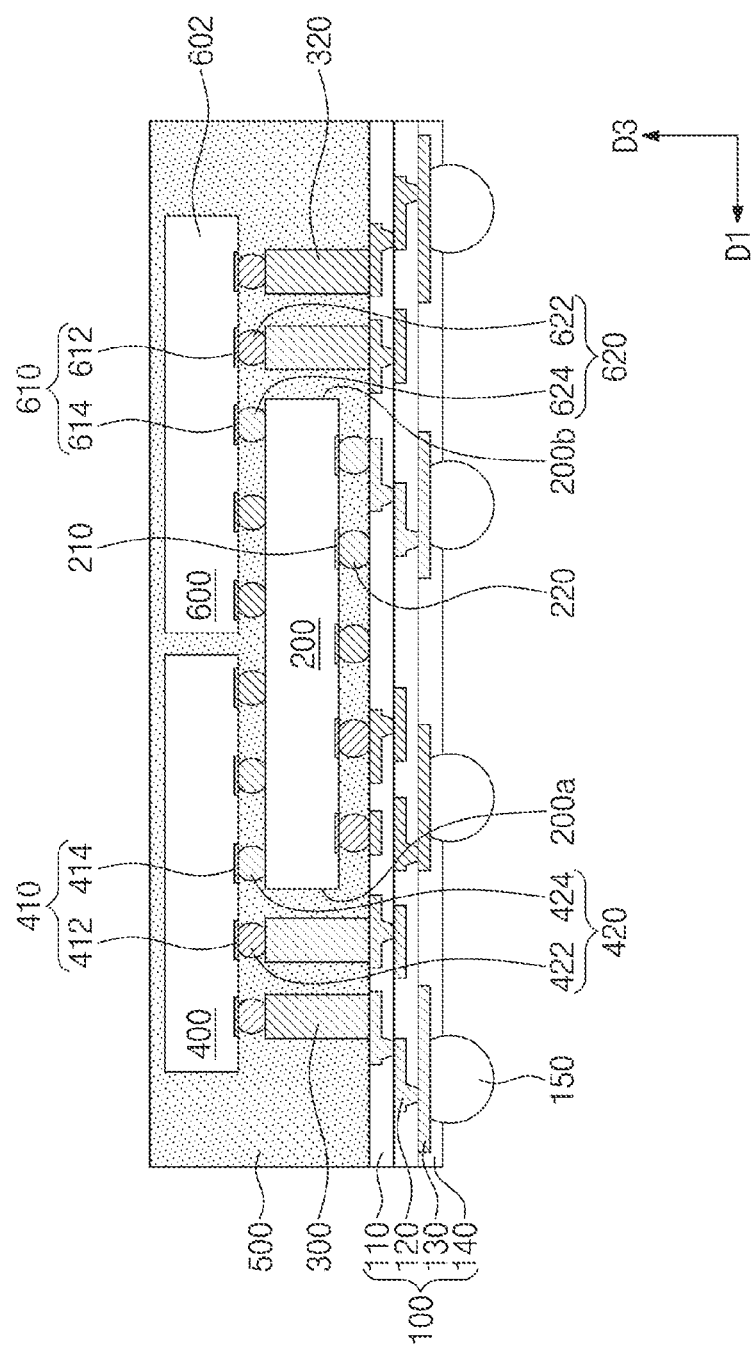
FIG. 8 illustrates a sectional view of a semiconductor package according to embodiments of the inventive concepts.
Figure 9:
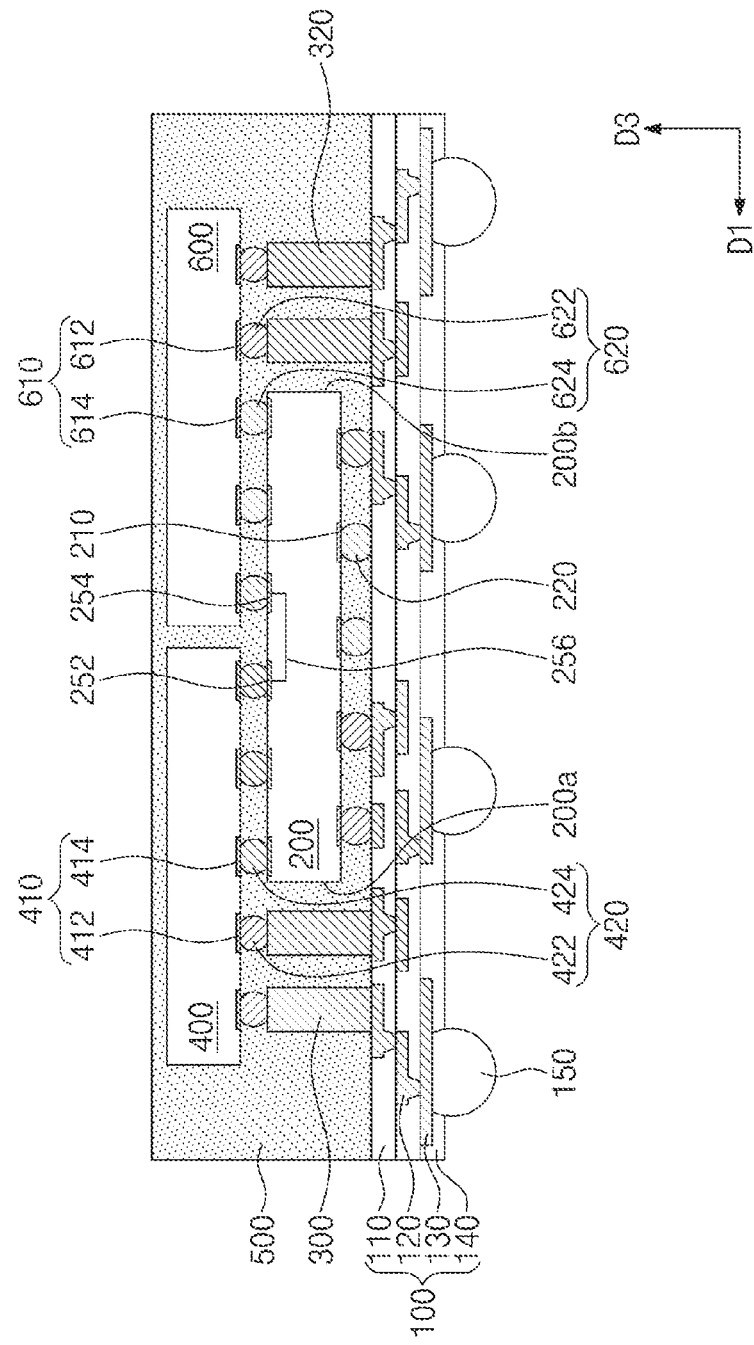
FIG. 9 illustrates a sectional view of a semiconductor package according to embodiments of the inventive concepts.

FIGS. 8 and 9 respectively illustrate sectional views of a semiconductor package according to embodiments of the inventive concepts.

Referring to FIG. 8, second conductive posts 320 may be disposed on the substrate 100. The second conductive posts 320 may be disposed around or adjacent the first semiconductor chip 200, and may be spaced apart from the first conductive posts 300 with the first semiconductor chip 200 interposed therebetween. For example, the second conductive posts 320 may be disposed adjacent to the second side surface 200b of the first semiconductor chip 200. The second conductive posts 320 may have a pillar shaped structure that is extended in the third direction D3. The second conductive posts 320 may be coupled to the substrate interconnection pattern 120 of the substrate 100. Top surfaces of the second conductive posts 320 may be located at the same level as the top surface of the first semiconductor chip 200, when measured the top surface of the substrate 100. Alternatively, the top surfaces of the second conductive posts 320 may be located at a level different from the top surface of the first semiconductor chip 200.

A third semiconductor chip 600 may be disposed on the first semiconductor chip 200 and the second conductive posts 320. The third semiconductor chip 600 may be placed on the rear surface of the first semiconductor chip 200. The third semiconductor chip 600 may be horizontally spaced apart from the second semiconductor chip 400. The third semiconductor chip 600 and the first semiconductor chip 200 may be disposed to form an offset stack structure. For example, the first and third semiconductor chips 200 and 600 may be stacked to form a stepwise structure that is upwardly inclined in the first direction D1. In detail, a portion of the third semiconductor chip 600 may be overlapped with the first semiconductor chip 200, and another portion of the third semiconductor chip 600 may protrude outwardly beyond one of side surfaces of the first semiconductor chip 200 along a direction opposite the first direction D1 so as not to overlap with the first semiconductor chip 200. For example, the third semiconductor chip 600 may include a portion that is outwardly extended to a region beyond the second side surface 200b of the first semiconductor chip 200. In other words, the third semiconductor chip 600 may be stacked on the first semiconductor chip 200 such that it is shifted from the first semiconductor chip 200 in an opposite direction of the first direction D1 when viewed in a plan view. Here, a portion of the third semiconductor chip 600, which protrudes outwardly beyond the second side surface 200b of the first semiconductor chip 200, may be placed on the second conductive posts 320. The front surface of the third semiconductor chip 600 (i.e., the bottom surface of the third semiconductor chip 600) may be substantially parallel to the top surface of the substrate 100.

The third semiconductor chip 600 may have the same or similar structure as the afore-described second semiconductor chip 400. In other words, the third semiconductor chip 600 and the second semiconductor chip 400 may be the same semiconductor chips, or in other words may be the same type of semiconductor chips or generally configured the same as each other. For example, the third semiconductor chip 600 may include third chip pads 610, which are provided on a top surface thereof.

The third semiconductor chip 600 may be mounted on the second conductive posts 320 in a flip-chip bonding manner. For example, the third semiconductor chip 600 may include a third base layer 602 on which the integrated circuit is formed, and the third chip pads 610 which are formed on a surface of the third base layer 602 provided with the integrated circuit. The third semiconductor chip 600 may be disposed such that the third chip pads 610 face the substrate 100. For example, the third semiconductor chip 600 may have a front surface facing the substrate 100. Third chip connection terminals 620 may be provided between the third chip pads 610 and the second conductive posts 320. The third semiconductor chip 600 may be connected to the substrate 100 through the third chip pads 610, the third chip connection terminals 620, the second conductive posts 320, and the substrate interconnection pattern 120.

The third chip pads 610 may include third signal pads 612 and third dummy pads 614. The third chip connection terminals 620 may include third signal solder terminals 622 provided on the third signal pads 612, and third dummy solder terminals 624 provided on the third dummy pads 614.

The third signal solder terminals 622 and the third dummy solder terminals 624 may be provided on the front surface of the third semiconductor chip 600. The third signal solder terminals 622 may be provided on the third signal pads 612, respectively, and the third dummy solder terminals 624 may be provided on the third dummy pads 614, respectively. The third signal solder terminals 622 may be provided near a side surface of the first semiconductor chip 200, and between the third signal pads 612 and the second conductive posts 320. The third signal solder terminals 622 may connect the third signal pads 612 to the second conductive posts 320. In other words, the third semiconductor chip 600 may be electrically connected to the substrate 100 through the third signal solder terminals 622 and the second conductive posts 320. The third dummy solder terminals 624 may be provided on the first semiconductor chip 200, and between the third dummy pads 614 and the rear surface of the first semiconductor chip 200. The third dummy solder terminals 624 may be provided on the rear surface of the first semiconductor chip 200 to support the third semiconductor chip 600. Here, the third dummy solder terminals 624 may be in direct contact with the rear surface of the first semiconductor chip 200.

The third signal solder terminals 622 may be electrically connected to the integrated circuit of the third semiconductor chip 600. The third dummy solder terminals 624 may be electrically disconnected from the third semiconductor chip 600. For example, although not shown in FIG. 8, the third semiconductor chip 600 may further include a third chip passivation layer, which is provided on a top surface thereof, and in this case, the third chip passivation layer may expose the third signal pads 612 and may cover the third dummy pads 614. The third signal solder terminals 622 may penetrate the third chip passivation layer and may be coupled to the third signal pads 612, and the third dummy solder terminals 624 may be spaced apart from the third dummy pads 614 by the third chip passivation layer. Alternatively, the third signal pads 612 and the third dummy pads 614 may be disposed on the third chip passivation layer, the third signal pads 612 may penetrate the third chip passivation layer and may be coupled to the integrated circuit of the third semiconductor chip 600, and the third dummy pads 614 may be electrically disconnected from the integrated circuit of the third semiconductor chip 600 by the third chip passivation layer.

According to embodiments of the inventive concepts, since the second and third semiconductor chips 400 and 600 are vertically overlapped with the first semiconductor chip 200, it may be possible to reduce a size of a semiconductor package. In addition, since the third semiconductor chip 600 is directly connected to the substrate 100 through the second conductive post 320, it may be possible to reduce a length of an electric connection path between the third semiconductor chip 600 and the substrate 100 and to improve electric characteristics of the semiconductor package. Furthermore, since the third semiconductor chip 600 on the first semiconductor chip 200 is supported by the third dummy solder terminals 624, it may be possible to improve structural stability of the semiconductor package. Thus, the third semiconductor chip 600 may be stably supported by the first semiconductor chip 200, and the semiconductor package may be provided to have improved structural stability.

FIG. 8 illustrates an example in which the second and third dummy solder terminals 424 and 624 are in direct contact with the first base layer 202 of the first semiconductor chip 200, but the inventive concepts are not limited to this example. As shown in FIG. 9, the first semiconductor chip 200 may include first upper pads 252 and second upper pads 254. The first upper pads 252 and the second upper pads 254 may be provided on the top surface of the first semiconductor chip 200. Here, the first upper pads 252 may be disposed between the second semiconductor chip 400 and the first semiconductor chip 200, and the second upper pads 254 may be disposed between the third semiconductor chip 600 and the first semiconductor chip 200. More specifically, the first upper pads 252 may be respectively provided at positions vertically corresponding to the second dummy pads 414 of the second semiconductor chip 400, and the second upper pads 254 may be respectively provided at positions vertically corresponding to the third dummy pads 614 of the third semiconductor chip 600. The second dummy solder terminals 424 may connect the first upper pads 252 to the second dummy pads 414. The third dummy solder terminals 624 may connect the second upper pads 254 to the third dummy pads 614.

In the embodiment of FIG. 9, the second dummy pads 414 and the second dummy solder terminals 424 may be electrically connected to the integrated circuit of the second semiconductor chip 400. The third dummy pads 614 and the third dummy solder terminals 624 may be electrically connected to the integrated circuit of the third semiconductor chip 600. The first upper pads 252 and the second upper pads 254 may be connected to each other through interconnection patterns 256, which are provided on or near the top surface of the first semiconductor chip 200. Accordingly, the second semiconductor chip 400 may be electrically connected to the third semiconductor chip 600 through the second dummy pads 414, the second dummy solder terminals 424, the first upper pads 252, the interconnection pattern 256, the second upper pads 254, the third dummy solder terminals 624, and the third dummy pads 614.

In an embodiment, the second dummy pads 414 and the second dummy solder terminals 424 may be electrically disconnected from the integrated circuit of the second semiconductor chip 400, and the third dummy pads 614 and the third dummy solder terminals 624 may be electrically disconnected from the integrated circuit of the third semiconductor chip 600. In this case, the interconnection pattern 256 may not be provided on the top surface of the first semiconductor chip 200.

According to embodiments of the inventive concepts, the second dummy solder terminals 424 may be coupled to the first upper pads 252 and the second dummy pads 414, and the third dummy solder terminals 624 may be coupled to the second upper pads 254 and the third dummy pads 614. In detail, the second and third dummy solder terminals 424 and 624 may be connected to the first and second upper pads 252 and 254, which are formed of a metallic material, through a soldering process, and thus the second and third semiconductor chips 400 and 600 may be more robustly bonded to the first semiconductor chip 200.

Figure 10:
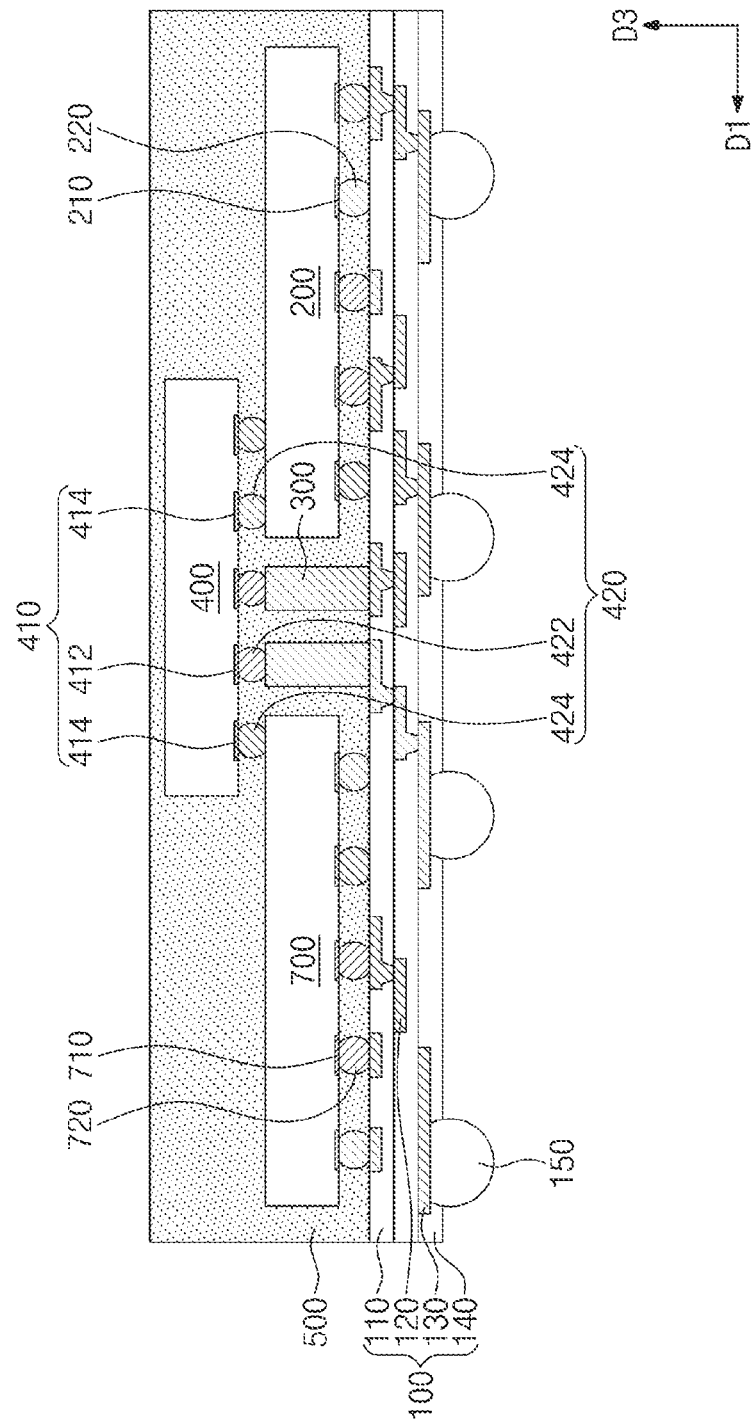
FIG. 10 illustrates a sectional view of a semiconductor package according to embodiments of the inventive concepts.

FIG. 10 illustrates a sectional view of a semiconductor package according to embodiments of the inventive concepts.

Referring to FIG. 10, a fourth semiconductor chip 700 may be disposed on the substrate 100. The fourth semiconductor chip 700 may be horizontally spaced apart from the first semiconductor chip 200. The fourth semiconductor chip 700 may be disposed near a side surface of the first semiconductor chip 200 in the first direction D1. Here, the first conductive posts 300 may be provided between the first semiconductor chip 200 and the fourth semiconductor chip 700.

The fourth semiconductor chip 700 may be provided to have substantially the same or similar structure as the afore-described first semiconductor chip 200. For example, the fourth semiconductor chip 700 may include fourth chip pads 710, which are provided on a first surface thereof.

The fourth semiconductor chip 700 may be mounted on the substrate 100 in a flip-chip bonding manner. For example, the fourth semiconductor chip 700 may include a fourth base layer 702 on which the integrated circuit is formed, and the fourth chip pads 710 which are formed on a surface of the fourth base layer 702 provided with the integrated circuit. The fourth semiconductor chip 700 may be disposed such that the fourth chip pads 710 face the substrate 100. Fourth chip connection terminals 720 may be provided between the fourth chip pads 710 and the substrate 100. The fourth semiconductor chip 700 may be connected to the substrate 100 through the fourth chip pads 710, the fourth chip connection terminals 720, and the substrate interconnection pattern 120.

The second semiconductor chip 400 may be disposed on the first semiconductor chip 200, the fourth semiconductor chip 700, and the first conductive posts 300. The second semiconductor chip 400 may be placed on the rear surface of the first semiconductor chip 200 and a rear surface of the fourth semiconductor chip 700. A portion of the second semiconductor chip 400 may be overlapped with the first semiconductor chip 200, and another portion of the second semiconductor chip 400 may be overlapped with the fourth semiconductor chip 700. A center portion of the second semiconductor chip 400, which is located between the two portions, may be placed on the first conductive posts 300.

The second semiconductor chip 400 may be mounted on the first conductive posts 300 in a flip-chip bonding manner. For example, the second semiconductor chip 400 may be disposed such that the second chip pads 410 face the substrate 100. The second chip connection terminals 420 may be provided between the second chip pads 410 and the first conductive posts 300. The second semiconductor chip 400 may be connected to the substrate 100 through the second chip pads 410, the second chip connection terminals 420, the first conductive posts 300, and the substrate interconnection pattern 120.

The second chip pads 410 may include the second signal pads 412 and the second dummy pads 414. The second chip connection terminals 420 may include the second signal solder terminals 422 provided on the second signal pads 412, and the second dummy solder terminals 424 provided on the second dummy pads 414.

The second signal solder terminals 422 may be provided on the second signal pads 412 respectively, and the second dummy solder terminals 424 may be provided on the second dummy pads 414 respectively. The second signal solder terminals 422 may be provided between the second signal pads 412 and the first conductive posts 300, so as not to overlap with the first semiconductor chip 200 and the fourth semiconductor chip 700. In other words, the second semiconductor chip 400 may be electrically connected to the substrate 100 through the second signal solder terminals 422 and the first conductive posts 300. The second dummy solder terminals 424 may be provided on the first semiconductor chip 200 (in particular, between the second dummy pads 414 and the rear surface of the first semiconductor chip 200) and on the fourth semiconductor chip 700 (in particular, between the second dummy pads 414 and the rear surface of the fourth semiconductor chip 700). The second dummy solder terminals 424 may be provided on the rear surface of the first semiconductor chip 200 and the rear surface of the fourth semiconductor chip 700 to support the second semiconductor chip 400. Here, each of the second dummy solder terminals 424 may be in direct contact with the rear surface of the first semiconductor chip 200 or the rear surface of the fourth semiconductor chip 700.

According to embodiments of the inventive concepts, since the second semiconductor chip 400 is disposed to be vertically overlapped with the first semiconductor chip 200 and the fourth semiconductor chip 700, it may be possible to reduce a size of a semiconductor package. In addition, since the second semiconductor chip 400 is supported by the first semiconductor chip 200 and the fourth semiconductor chip 700, it may be possible to improve the structural stability of the semiconductor package.

FIGS. 11 to 18 illustrate sectional views descriptive a method of fabricating a semiconductor package, according to embodiments of the inventive concepts.

Figure 11:
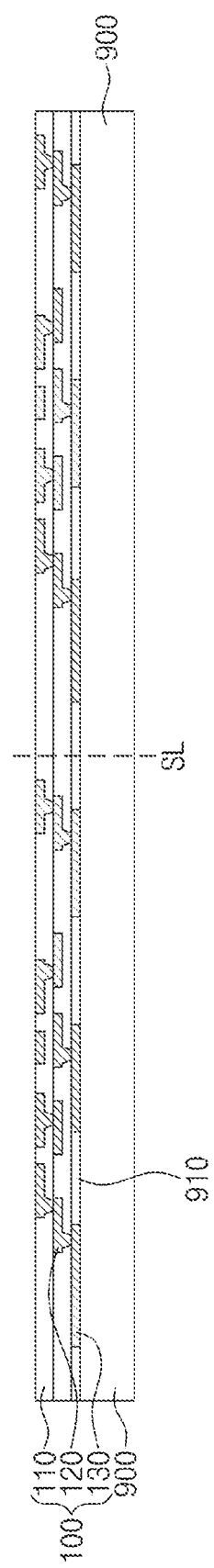
FIGS. 11, 12, 13, 14, 15, 16, 17 and 18 illustrate sectional views descriptive of a method of fabricating a semiconductor package, according to embodiments of the inventive concepts.

Referring to FIG. 11, a carrier substrate 900 is provided. The carrier substrate 900 may be for example an insulating substrate, which is formed of or includes glass or polymer, or a conductive substrate including a metallic material. Although not shown, an adhesive member may be provided on a top surface of the carrier substrate 900. As an example, the adhesive member may include an adhesive tape.

The substrate 100 is formed on the carrier substrate 900. Hereinafter, the formation of the substrate 100 will be described in more detail.

A lower insulating layer 910 is provided on the carrier substrate 900. The lower insulating layer 910 may be formed of or include at least one of insulating polymers or photo-imageable polymers.

The substrate pads 130 are formed in the lower insulating layer 910. For example, the formation of the substrate pads 130 may include patterning the lower insulating layer 910 to form openings for the substrate pads 130, conformally forming a seed layer in the openings, and performing a plating process, in which the seed layer is used as a seed, to fill the openings.

The substrate insulating layer 110 is formed on the lower insulating layer 910. The substrate insulating layer 110 may be formed by a coating process (e.g., a spin coating process or a slit coating process). The substrate insulating layer 110 may be formed of or include at least one of photoimageable polymers (e.g., photo imageable dielectric (PID)). In an embodiment, the photoimageable polymers may for example include photo-imageable polyimides, polybenzoxazole (PBO), phenol-based polymers, and benzocyclobutene-based polymers.

The substrate interconnection pattern 120 is formed. For example, the formation of the substrate interconnection pattern 120 may include patterning the substrate insulating layer 110 to form openings exposing the substrate pads 130, forming a barrier layer and a conductive layer on the substrate insulating layer 110 to fill the openings, and performing a planarization process on the barrier layer and the conductive layer. As a result, a substrate interconnection layer having the substrate insulating layer 110 and the substrate interconnection pattern 120 is formed. The process of forming the substrate interconnection layer may be repeated to form the substrate 100 with the substrate interconnection layers. The substrate interconnection pattern 120 in the uppermost one of the substrate interconnection layer may correspond to a substrate pad of the substrate 100.

Figure 12:
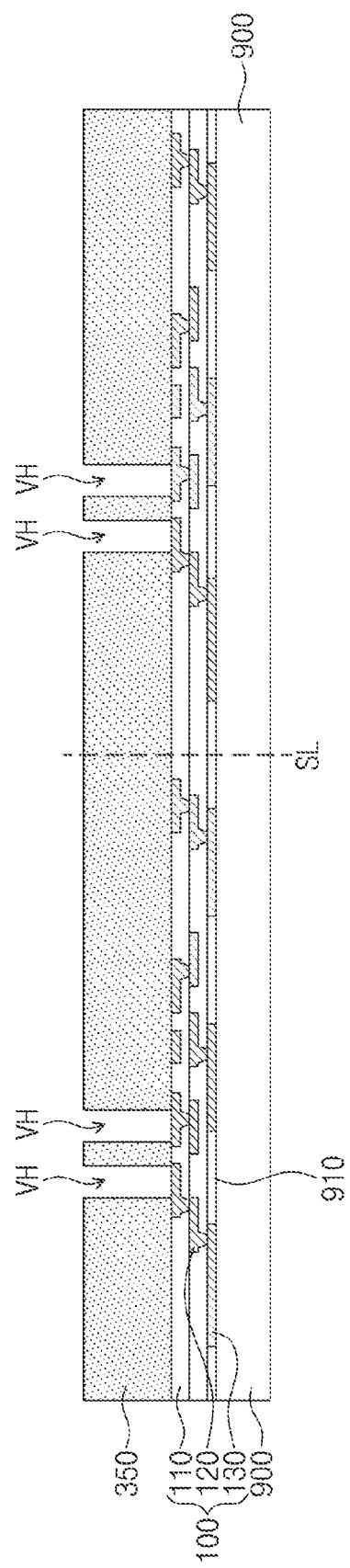

Referring to FIG. 12, a sacrificial layer 350 is formed on the substrate 100. For example, the sacrificial layer 350 may be formed by coating materials, which can be easily removed in a subsequent process, on the substrate 100. The coating process may include a spin coating process or the like.

The sacrificial layer 350 is patterned to form penetration holes VH. The penetration holes VH are formed to vertically penetrate the sacrificial layer 350 and to expose the substrate interconnection pattern 120 of the substrate 100. Each of the penetration holes VH define a space in which the first conductive post 300 will be formed. Each of the penetration holes VH may have a width that decreases with decreasing distance from the substrate 100. Alternatively, each of the penetration holes VH may have a constant width, regardless of a distance from the substrate 100.

Figure 13:
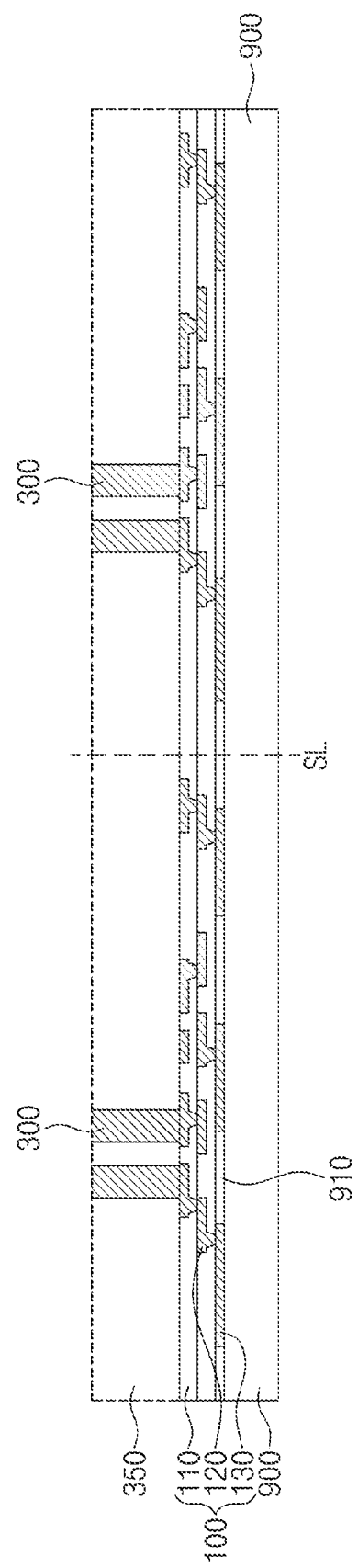

Referring to FIG. 13, the first conductive posts 300 are formed. For example, a conductive layer may be deposited on the sacrificial layer 350. Here, the conductive layer may be formed to fill the penetration holes VH (e.g., see FIG. 12) and to be in contact with the substrate interconnection pattern 120 exposed through the penetration holes VH. The conductive layer may be formed by a plating process (e.g., an electrolytic plating). For example, a seed layer may be conformally deposited on the sacrificial layer 350, and then the conductive layer may be deposited using the seed layer as a seed.

A planarization process is performed on the conductive layer. A top surface of the sacrificial layer 350 may be exposed by the planarization process. In an embodiment, the planarization process may be performed to remove a portion of the conductive layer located on the top surface of the sacrificial layer 350, and as a result the first conductive posts 300 may be formed in the penetration holes VH.

Thereafter, the sacrificial layer 350 is removed.

Figure 14:
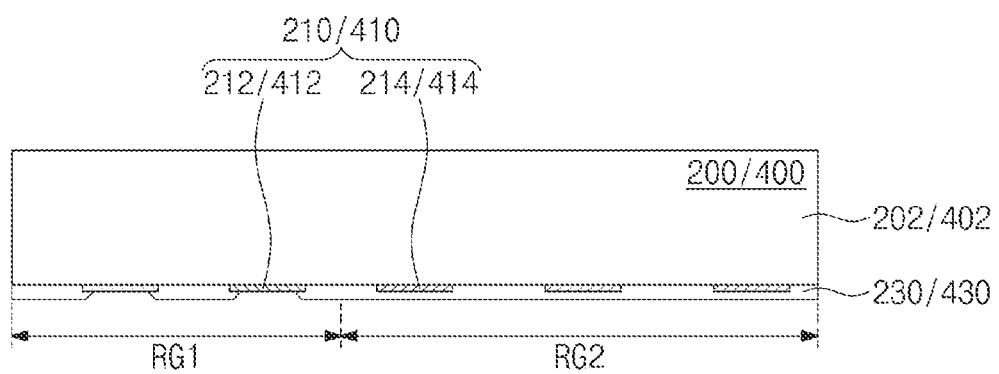

Referring to FIG. 14, the first semiconductor chip(s) 200 is (are) provided. FIG. 14 illustrates an example structure of the first semiconductor chip 200 or the second semiconductor chip 400, and in the present embodiment the first and second semiconductor chips 200 and 400 will be assumed to have the structure of FIG. 14. The first semiconductor chip 200 may be provided to have the same structure as described with reference to FIGS. 1 to 10. For example, the first semiconductor chip 200 may include the first base layer 202 on which an integrated circuit is formed, and the first chip pads 210 which are formed on a front surface of the first base layer 202 provided with the integrated circuit. The first chip pads 210 may include the first signal pads 212 which are provided in the first region RG1 of the first semiconductor chip 200, and the first dummy pads 214 which are provided in the second region RG2 of the first semiconductor chip 200. The first semiconductor chip 200 may further include the first chip passivation layer 230 which is provided on a top surface thereof. The first chip passivation layer 230 may cover the front surface of the first semiconductor chip 200, may expose the first signal pads 212, and may cover the first dummy pads 214.

Figure 15:
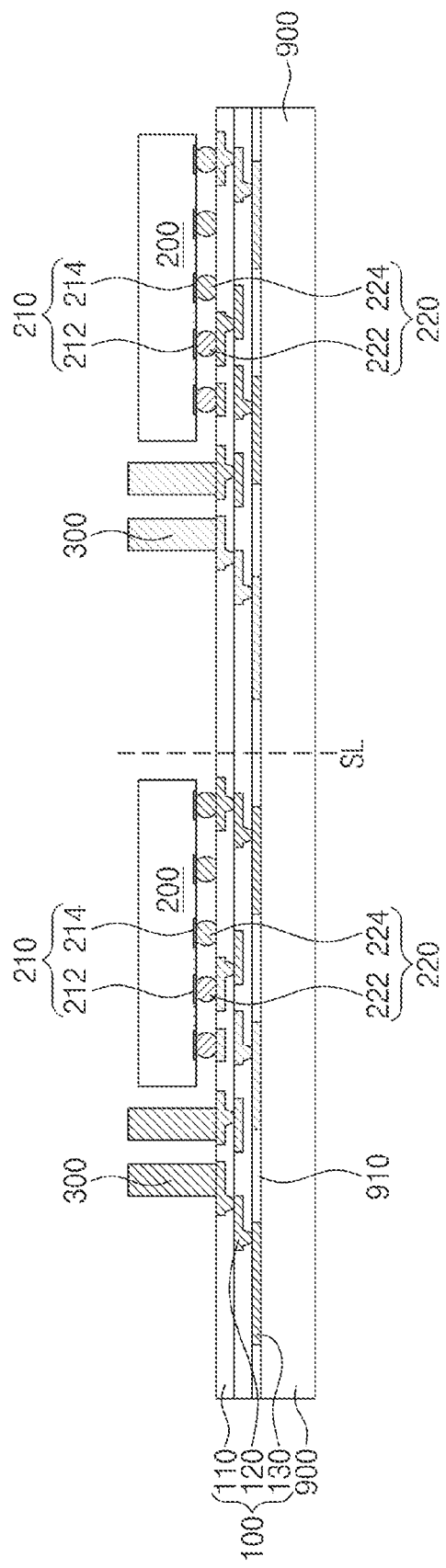

Referring to FIG. 15, the first semiconductor chips 200 are mounted on the substrate 100. For example, solder balls may be provided on the first chip pads 210 of the first semiconductor chip 200. The first semiconductor chips 200 may be placed on the substrate 100 such that the first signal pads 212 are aligned to the substrate interconnection patterns 120 of the substrate 100. Here, the first semiconductor chips 200 are horizontally spaced apart from the first conductive posts 300. Thereafter, the first semiconductor chips 200 may be moved downward such that the solder balls are in contact with the substrate interconnection patterns 120, and then a reflow process may be performed on the solder balls to form the first chip connection terminals 220 connecting the first semiconductor chips 200 to the substrate 100.

During the soldering process, the solder balls may be melted, and a distance between the first semiconductor chips 200, which are located on the solder balls, and the substrate 100 may depend on a peripheral environment (e.g., a weight of the first semiconductor chips 200, external pressure, temperature, and so forth). Accordingly, after the soldering process, the top surface of the first semiconductor chips 200 may be located at a level that is equal to or different from the top surfaces of the first conductive posts 300, when measured from the substrate 100. For example, as shown in FIG. 15, the top surface of the first semiconductor chips 200 may be located at a level that is lower than the top surface of the first conductive posts 300, when measured from the substrate 100. However, the inventive concepts are not limited to this example, and the top surface of the first semiconductor chips 200 may be located at a level that is higher than the top surface of the first conductive post 300, when measured from the substrate 100.

Referring back to FIG. 14, the second semiconductor chip(s) 400 is/are provided. The second semiconductor chip 400 may be provided to have the same structure as described with reference to FIGS. 1 to 10. For example, the second semiconductor chip 400 may include the second base layer 402 on which an integrated circuit is formed, and the second chip pads 410 which are formed on a front surface of the second base layer 402 provided with the integrated circuit. The second chip pads 410 may include the second signal pads 412 which are provided in the first region RG1 of the second semiconductor chip 400, and the second dummy pads 414 which are provided in the second region RG2 of the second semiconductor chip 400. The second semiconductor chip 400 may further include the second chip passivation layer 430, which is provided on a top surface thereof. The second chip passivation layer 430 may cover the front surface of the second semiconductor chip 400, may expose the second signal pads 412, and may cover the second dummy pads 414.

Figure 16:
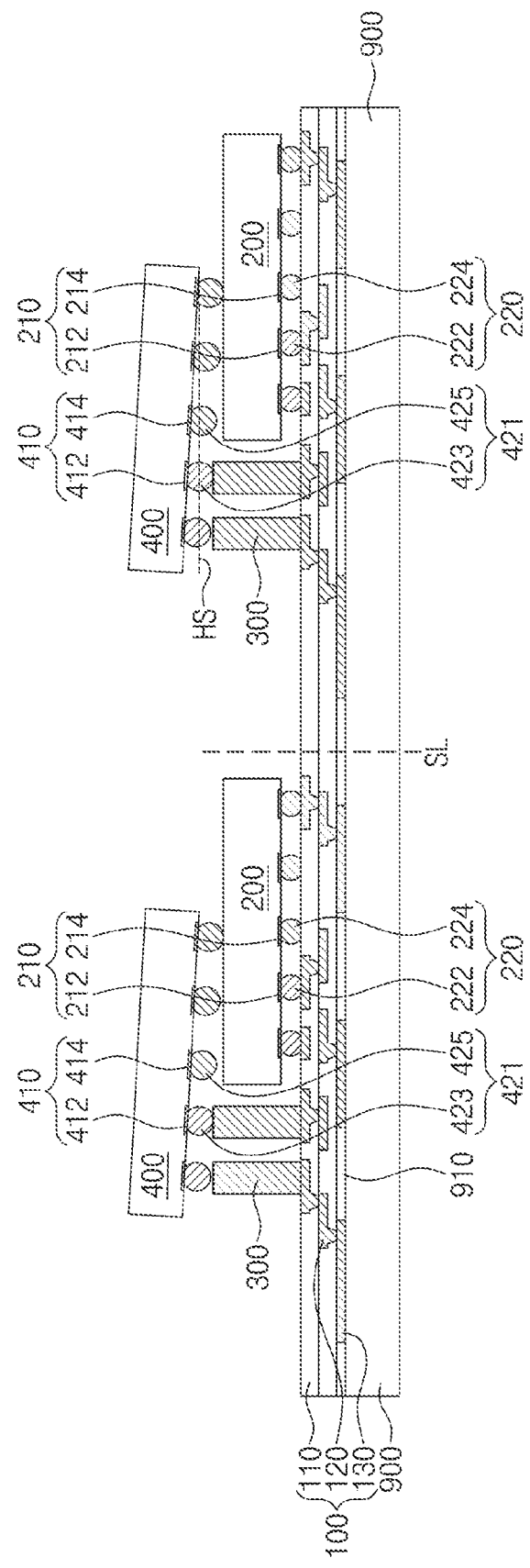

Referring to FIG. 16, the second semiconductor chips 400 are provided on the substrate 100. For example, solder balls 421 may be provided on the second chip pads 410 of the second semiconductor chips 400. The solder balls 421 may include first solder balls 423 disposed on the second signal pads 412, and second solder balls 425 disposed on the second dummy pads 414. The first solder balls 423 and the second solder balls 425 may have the same volume.

The second semiconductor chips 400 may be placed on the first semiconductor chips 200 and the first conductive posts 300 such that the first solder balls 423 are aligned with the first conductive posts 300, and the second solder balls 425 are placed on the top surface of the first semiconductor chips 200. Thereafter, the second semiconductor chips 400 may be lowered such that the solder balls 421 are in contact with the first semiconductor chips 200 and the first conductive posts 300. Here, since the top surface of the first semiconductor chips 200 and the top surfaces of the first conductive posts 300 are located at different levels from the substrate 100, the second semiconductor chips 400 may be inclined with respect to the first semiconductor chips 200. For example, since the first solder balls 423 are located at a level higher than the second solder balls 425, the bottom surface of the second semiconductor chips 400 may be inclined at an angle with respect to a flat surface (or horizontal plane) HS that is parallel to the top surface of the substrate 100. That is, the second semiconductor chips 400 may be inclined at an angle with respect to the top surface of the substrate 100 or the top surface of the first semiconductor chips 200, and in this case, some of the solder balls 421 may not be in contact with the top surface of the first semiconductor chips 200 or the first conductive posts 300.

Figure 17:
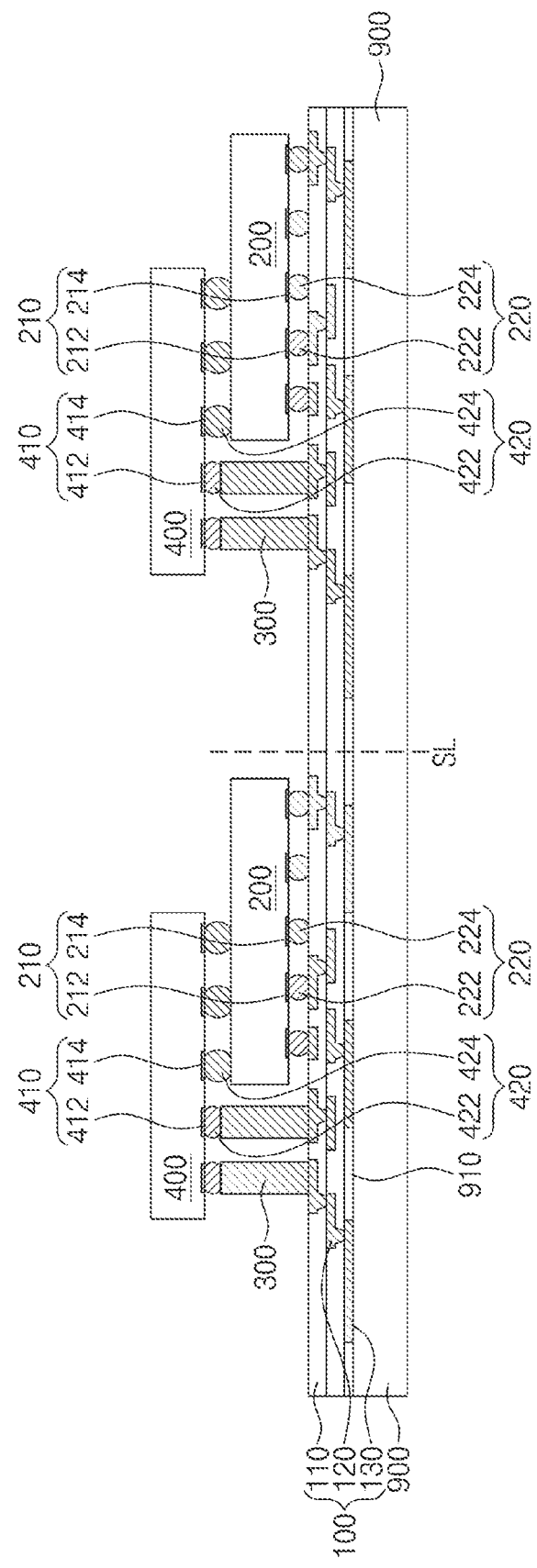

Referring to FIG. 17, a reflow process is performed on the solder balls 421 (e.g., see FIG. 16) to form the second signal solder terminals 422 which connect the second semiconductor chip 400 to the first conductive posts 300, and the second dummy solder terminals 424 which are placed on the first semiconductor chip 200.

During the reflow process, the solder balls 421 in FIG. 16 are melted, and thus the second semiconductor chips 400 located on the solder balls 421 may be leveled such that the bottom surface of the second semiconductor chips 400 are parallel to the top surface of the substrate 100. Accordingly, the second signal solder terminals 422 shown in FIG. 17 may be in contact with the first conductive posts 300 respectively, and the second dummy solder terminals 424 may be in contact with the top surface of the first semiconductor chips 200. Since the second semiconductor chips 400 are parallel to the substrate 100, and the top surface of the first semiconductor chips 200 are located at a level different from the top surfaces of the first conductive posts 300, the second signal solder terminals 422 and the second dummy solder terminals 424 may have different vertical heights with respect to each other. For example, in the case where as shown in FIG. 17 the top surfaces of the first conductive posts 300 are higher than the top surface of the first semiconductor chips 200, the height of the second signal solder terminals 422 may be smaller than the height of the second dummy solder terminals 424. In an embodiment in the case where the top surfaces of the first conductive posts 300 are lower than the top surface of the first semiconductor chips 200, the height of the second signal solder terminals 422 may be greater than the height of the second dummy solder terminals 424.

In a case where the second semiconductor chips 400 are attached to the first semiconductor chips 200 using an adhesive agent, the second semiconductor chips 400 are fastened to the first semiconductor chips 200. In the case where the second semiconductor chips 400 are attached using the adhesive agent and are inclined due to the height difference of the first semiconductor chips 200 and the first conductive posts 300, the second semiconductor chips 400 on the first semiconductor chips 200 can not be leveled because the second semiconductor chips 400 are fastened to the first semiconductor chips 200. That is, in such a case it would be impossible to adjust a slope or inclination of the second semiconductor chips 400.

In contrast, according to embodiments of the inventive concepts, the second chip connection terminals 420 may be used to adjust a slope or inclination of the upper semiconductor chips that occurs due to a difference in level between the top surface of the first semiconductor chips 200 and the top surfaces of the first conductive posts 300. In other words, according to embodiments of the inventive concepts, even though a height difference may exist between the first semiconductor chips 200 and the first conductive posts 300, it is possible to prevent connection failure of the second chip connection terminals 420 of the second semiconductor chips 400 and to thus fabricate a highly-reliable semiconductor package.

Figure 18:
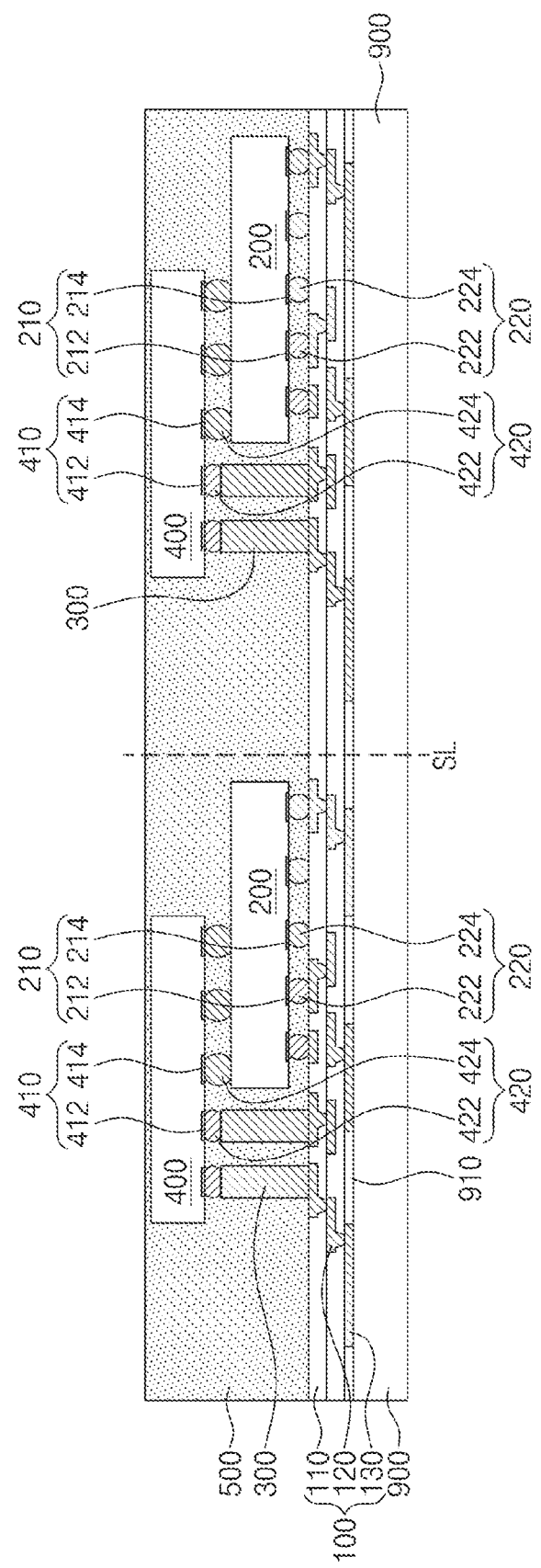

Referring to FIG. 18, the mold layer 500 is formed on the substrate 100. For example, an insulating material may be formed on the top surface of the substrate 100 to encapsulate the first semiconductor chips 200, the first conductive posts 300, and the second semiconductor chips 400 and then the insulating material may be solidified to form the mold layer 500. The mold layer 500 may be provided to fill a space between the substrate 100 and the second semiconductor chips 400 and to enclose the first conductive posts 300. In an embodiment, the carrier substrate 900, the substrate 100 and the mold layer 500 may be cut or diced along saw line SL to provide separate packages each including a first semiconductor chip 200 and a second semiconductor chip 400.

Referring back to FIG. 1, the carrier substrate 900 may be removed. Accordingly, the bottom surface of the substrate 100 (e.g., the substrate pads 130 of the substrate 100) may be exposed.

Thereafter, the lower insulating layer 910 may be removed, and the substrate protection layer 140 may be formed on a bottom surface of the substrate 100. For example, the substrate protection layer 140 may be formed under the substrate insulating layer 110 to cover the substrate interconnection pattern 120 and the substrate pads 130. In an embodiment, an insulating layer may be additionally deposited on the lower insulating layer 910. The lower insulating layer 910, along with the insulating layer, may form the substrate protection layer 140.

Thereafter, the substrate protection layer 140 may be patterned to expose the substrate pads 130. The outer terminals 150 may be provided on the exposed substrate pads 130. The semiconductor package described with reference to FIG. 1 may be fabricated through the aforedescribed process.

In a semiconductor package according to embodiments of the inventive concepts, dummy solder terminals may be disposed in a region in which signal solder terminals are not provided, to support a semiconductor chip in an upward direction, so that the semiconductor chip may be more robustly disposed on a substrate or another semiconductor chip. In addition, the dummy solder terminals may be disposed regardless of an interconnection structure in each of the semiconductor chips, and the dummy solder terminals may be disposed in various manners (e.g., number and/or patterns/configurations) depending on a shape and a thickness of the semiconductor chips. Thus, it may be possible to more stably support the semiconductor chips and to realize a semiconductor package with improved structural stability.

In a semiconductor package according to embodiments of the inventive concepts, it may be possible to reduce an area of a region which is occupied by semiconductor chips, to thereby realize a small-size semiconductor package. In addition, an electric connection path between an upper semiconductor chip and a substrate may have short length, and a semiconductor package may be provided to have improved electric characteristics.

In a method of fabricating a semiconductor package according to embodiments of the inventive concepts, the dummy solder terminals may be used to adjust a slope or inclination of an upper semiconductor chip that may occur due to a difference in level between a top surface of a semiconductor chip and top surfaces of conductive posts. Accordingly, it may be possible to reduce semiconductor package process fabrication failure and to realize a semiconductor package with improved structural stability.

While example embodiments of the inventive concepts have been particularly shown and described, it should be understood by one of ordinary skill in the art that variations in form and detail may be made therein without departing from the spirit and scope of the attached claims.

What is claimed is:

1. A semiconductor package, comprising:
a first semiconductor chip mounted on a substrate in a flip-chip bonding manner;
a first conductive post disposed on the substrate and spaced apart from the first semiconductor chip, the first conductive post extending vertically to couple to the substrate;
a second semiconductor chip disposed on the first semiconductor chip and the first conductive post, the second semiconductor chip including a signal pad and a dummy pad on a bottom surface of the second semiconductor chip; and
a mold layer on the substrate that covers the first semiconductor chip, the second semiconductor chip, and the first conductive post,
wherein the second semiconductor chip is supported on the first semiconductor chip by a first dummy solder terminal, and the first dummy solder terminal is between the first semiconductor chip and the dummy pad of the second semiconductor chip,
the second semiconductor chip is coupled to the first conductive post by a first signal solder terminal, and the first signal solder terminal is between the first conductive post and the dummy pad of the second semiconductor chip,
the first dummy solder terminal is in direct contact with a top surface of the first semiconductor chip, and is electrically disconnected from the second semiconductor chip,
the signal pad, the first signal solder terminal and the first conductive post are vertically aligned,
the first dummy solder terminal and the first signal solder terminal include solder balls or solder bumps,
the top surface of the first semiconductor chip and a top surface of the first conductive post are located at different levels from a top surface of the substrate, and
a height difference between the top surface of the first semiconductor chip and the top surface of the first conductive post measured from the substrate is smaller than a first height of the first signal solder terminal and a second height of the first dummy solder terminal.

2. The semiconductor package of claim 1, wherein the first semiconductor chip has a first active surface facing the substrate,
the second semiconductor chip has a second active surface facing the substrate, and
the second semiconductor chip and the first semiconductor chip are shifted from each other, and a part of the second active surface of the second semiconductor chip is not overlapped with the first semiconductor chip.

3. The semiconductor package of claim 1, wherein the second semiconductor chip has a first region that is overlapped with the first semiconductor chip, and a second region disposed beyond the first semiconductor chip when viewed in a plan view,
the first dummy solder terminal is disposed in the first region, and
the first signal solder terminal is disposed in the second region.

4. The semiconductor package of claim 3, wherein the second semiconductor chip comprises:
a dummy pad on a bottom surface of the second semiconductor chip and in the first region;
a signal pad on the bottom surface of the second semiconductor chip and in the second region; and
a passivation layer on the bottom surface of the second semiconductor chip that covers the dummy pad and a portion of the signal pad, the passivation layer exposes another portion of the signal pad,
wherein the first dummy solder terminal is spaced apart from the dummy pad by the passivation layer, and
the first signal solder terminal is coupled to the signal pad and electrically connected to an integrated circuit of the second semiconductor chip.

5. The semiconductor package of claim 3, wherein the second semiconductor chip comprises:
a passivation layer covering a bottom surface of the second semiconductor chip;
a dummy pad on the passivation layer and in the first region, the dummy pad is electrically disconnected from an integrated circuit of the second semiconductor chip by the passivation layer; and
a signal pad on the passivation layer and in the second region, the signal pad penetrates the passivation layer and is coupled to the integrated circuit of the second semiconductor chip,
wherein the first dummy solder terminal is connected to the dummy pad, and
the first signal solder terminal connects the signal pad to the first conductive post.

6. The semiconductor package of claim 1, wherein a bottom surface of the second semiconductor chip is substantially parallel to the top surface of the substrate, and
the first height of the first signal solder terminal is different from the second height of the first dummy solder terminal.

7. The semiconductor package of claim 1, further comprising:
a plurality of additional first conductive posts disposed on the substrate and spaced apart from the first semiconductor chip;
a plurality of additional first signal solder terminals respectively connected to the plurality of additional first conductive posts; and a plurality of additional first dummy solder terminals between the first semiconductor chip and the second semiconductor chip, wherein distances between the plurality of additional first dummy solder terminals are larger than distances between the plurality of additional first signal solder terminals.

8. A semiconductor package, comprising:

a first semiconductor chip mounted on a substrate;

a first conductive post disposed on the substrate and spaced apart from the first semiconductor chip;

a second semiconductor chip disposed on the first semiconductor chip and the first conductive post;

a third semiconductor chip mounted on the substrate and horizontally spaced apart from the first semiconductor chip, and a mold layer on the substrate that covers the first semiconductor chip, the second semiconductor chip, and the first conductive post, wherein the second semiconductor chip is supported on the first semiconductor chip by a first dummy solder terminal, and the first dummy solder terminal is between the first semiconductor chip and the second semiconductor chip, the second semiconductor chip is coupled to the first conductive post by a first signal solder terminal, and the first signal solder terminal is between the first conductive post and the second semiconductor chip, the first dummy solder terminal is in direct contact with a top surface of the first semiconductor chip, and is electrically disconnected from the second semiconductor chip, wherein the semiconductor package further comprises:

a second conductive post disposed on the substrate and spaced apart from the first semiconductor chip; and a third semiconductor chip disposed on the first semiconductor chip and the second conductive post, and horizontally spaced apart from the second semiconductor chip, wherein the third semiconductor chip is supported by a second dummy solder terminal disposed between the first semiconductor chip and the third semiconductor chip, the third semiconductor chip is coupled to the second conductive post through a second signal solder terminal disposed between the second conductive post and the third semiconductor chip, the second dummy solder terminal is in direct contact with the top surface of the first semiconductor chip, and is electrically disconnected from the third semiconductor chip.

9. A semiconductor package, comprising:

a first semiconductor chip mounted on a substrate;

a first conductive post disposed on the substrate and spaced apart from the first semiconductor chip;

a second semiconductor chip disposed on the first semiconductor chip and the first conductive post;

a third semiconductor chip mounted on the substrate and horizontally spaced apart from the first semiconductor chip, and a mold layer on the substrate that covers the first semiconductor chip, the second semiconductor chip, and the first conductive post, wherein the second semiconductor chip is supported on the first semiconductor chip by a first dummy solder terminal, and the first dummy solder terminal is between the first semiconductor chip and the second semiconductor chip, the second semiconductor chip is coupled to the first conductive post by a first signal solder terminal, and the first signal solder terminal is between the first conductive post and the second semiconductor chip, and the first dummy solder terminal is in direct contact with a top surface of the first semiconductor chip, and is electrically disconnected from the second semiconductor chip, wherein the second semiconductor chip overlaps a portion of the first semiconductor chip and a portion of the third semiconductor chip, the second semiconductor chip is disposed on the third semiconductor chip and is supported by a third dummy solder terminal disposed between the second semiconductor chip and the third semiconductor chip, and the first conductive post is disposed between the first semiconductor chip and the third semiconductor chip, and connects the second semiconductor chip to the substrate.

* * * * *